United States Patent
He et al.

(10) Patent No.: US 9,816,194 B2
(45) Date of Patent: Nov. 14, 2017

(54) CONTROL OF ELECTROLYTE FLOW DYNAMICS FOR UNIFORM ELECTROPLATING

(71) Applicant: Lam Research Corporation, Fremont, CA (US)

(72) Inventors: Zhian He, Lake Oswego, OR (US); Jian Zhou, West Linn, OR (US); Jingbin Feng, Lake Oswego, OR (US); Jonathan D. Reid, Sherwood, OR (US); Shantinath Ghongadi, Tigard, OR (US)

(73) Assignee: Lam Research Corporation, Fremont, CA (US)

( * ) Notice: Subject to any disclaimer, the term of this patent is extended or adjusted under 35 U.S.C. 154(b) by 329 days.

(21) Appl. No.: 14/662,823

(22) Filed: Mar. 19, 2015

(65) Prior Publication Data
US 2016/0273119 A1    Sep. 22, 2016

(51) Int. Cl.
*C25D 5/08* (2006.01)
*C25D 17/00* (2006.01)
(Continued)

(52) U.S. Cl.
CPC .................. *C25D 5/08* (2013.01); *C25D 5/04* (2013.01); *C25D 5/18* (2013.01); *C25D 7/123* (2013.01);
(Continued)

(58) Field of Classification Search
CPC ....................................................... C25D 5/08
See application file for complete search history.

(56) References Cited

U.S. PATENT DOCUMENTS

| | | | |
|---|---|---|---|
| 3,652,442 A | 3/1972 | Powers et al. | |
| 3,706,651 A | 12/1972 | Leland | |

(Continued)

FOREIGN PATENT DOCUMENTS

| | | | |
|---|---|---|---|
| CN | 1624207 A | 6/2005 | |
| CN | 1705774 A | 12/2005 | |

(Continued)

OTHER PUBLICATIONS

U.S. Office Action dated Oct. 26, 2007 issued in U.S. Appl. No. 11/040,359.

(Continued)

*Primary Examiner* — Bryan D. Ripa
(74) *Attorney, Agent, or Firm* — Weaver Austin Villeneuve & Sampson LLP

(57) ABSTRACT

The uniformity of electroplating a metal (e.g., copper) on a semiconductor wafer is improved by using an electroplating apparatus having a flow-shaping element positioned in the proximity of the semiconductor wafer, wherein the flow-shaping element is made of a resistive material and has two types of non-communicating channels made through the resistive material, such that the electrolyte is transported towards the substrate through both types of channels. The first type of channels is not perpendicular to the plane defined by a plating face of the substrate. The second type of channels is perpendicular to the plane defined by the plating face of the substrate. The channels of the first and second type are substantially spatially segregated. In one embodiment a plurality of channels of the first type are located in the central portion of the flow-shaping element and are surrounded by a plurality of channels of the second type.

14 Claims, 23 Drawing Sheets

(51) Int. Cl.
  *C25D 5/18* (2006.01)
  *C25D 7/12* (2006.01)
  *C25D 5/04* (2006.01)
  *C25D 21/10* (2006.01)
  *H01L 21/288* (2006.01)
  *H01L 21/768* (2006.01)

(52) U.S. Cl.
  CPC ............ *C25D 17/001* (2013.01); *C25D 21/10* (2013.01); *C25D 17/002* (2013.01); *H01L 21/2885* (2013.01); *H01L 21/76877* (2013.01)

(56) References Cited

U.S. PATENT DOCUMENTS

| | | | |
|---|---|---|---|
| 3,862,891 A | 1/1975 | Smith | |
| 4,033,833 A | 7/1977 | Bestel et al. | |
| 4,082,638 A | 4/1978 | Jumer | |
| 4,240,886 A | 12/1980 | Hodges et al. | |
| 4,272,335 A | 6/1981 | Combs | |
| 4,304,641 A | 12/1981 | Grandia et al. | |
| 4,389,297 A | 6/1983 | Korach | |
| 4,409,339 A | 10/1983 | Matsuda et al. | |
| 4,469,564 A | 9/1984 | Okinaka et al. | |
| 4,545,877 A | 10/1985 | Hillis | |
| 4,604,177 A | 8/1986 | Sivilotti | |
| 4,604,178 A | 8/1986 | Flegener et al. | |
| 4,605,482 A | 8/1986 | Shiragami et al. | |
| 4,696,729 A | 9/1987 | Santini | |
| 4,828,654 A | 5/1989 | Reed | |
| 4,906,346 A | 3/1990 | Hadersbeck et al. | |
| 4,931,149 A | 6/1990 | Stierman et al. | |
| 4,933,061 A | 6/1990 | Kulkarni et al. | |
| 5,000,827 A | 3/1991 | Schuster et al. | |
| 5,035,784 A | 7/1991 | Anderson et al. | |
| 5,039,381 A | 8/1991 | Mullarkey | |
| 5,078,852 A | 1/1992 | Yee et al. | |
| 5,096,550 A | 3/1992 | Mayer et al. | |
| 5,146,136 A | 9/1992 | Ogura et al. | |
| 5,156,730 A | 10/1992 | Bhatt et al. | |
| 5,162,079 A | 11/1992 | Brown | |
| 5,217,586 A | 6/1993 | Datta et al. | |
| 5,316,642 A | 5/1994 | Young, Jr. et al. | |
| 5,332,487 A | 7/1994 | Young et al. | |
| 5,368,711 A | 11/1994 | Poris | |
| 5,391,285 A | 2/1995 | Lytle et al. | |
| 5,421,987 A | 6/1995 | Tzanavaras et al. | |
| 5,443,707 A | 8/1995 | Mori | |
| 5,452,053 A | 9/1995 | Nozue | |
| 5,472,592 A | 12/1995 | Lowery | |
| 5,476,578 A | 12/1995 | Forand | |
| 5,498,325 A | 3/1996 | Nishimura et al. | |
| 5,516,412 A | 5/1996 | Andricacos et al. | |
| 5,567,300 A | 10/1996 | Datta et al. | |
| 5,660,699 A | 8/1997 | Saito et al. | |
| 5,723,028 A | 3/1998 | Poris | |
| 5,744,019 A | 4/1998 | Ang | |
| 5,935,402 A | 8/1999 | Fanti | |
| 6,004,440 A | 12/1999 | Hanson et al. | |
| 6,027,631 A | 2/2000 | Broadbent | |
| 6,080,291 A | 6/2000 | Woodruff et al. | |
| 6,106,687 A | 8/2000 | Edelstein | |
| 6,126,798 A | 10/2000 | Reid et al. | |
| 6,132,587 A | 10/2000 | Jorne et al. | |
| 6,132,805 A | 10/2000 | Moslehi | |
| 6,156,167 A | 12/2000 | Patton et al. | |
| 6,179,983 B1 | 1/2001 | Reid et al. | |
| 6,193,860 B1 | 2/2001 | Weling | |
| 6,228,231 B1 | 5/2001 | Uzoh | |
| 6,251,255 B1 | 6/2001 | Copping et al. | |
| 6,261,433 B1 | 7/2001 | Landau | |
| 6,368,475 B1 | 4/2002 | Hanson et al. | |
| 6,391,166 B1 | 5/2002 | Wang | |
| 6,391,188 B1 | 5/2002 | Goosey | |
| 6,395,152 B1 | 5/2002 | Wang | |
| 6,398,926 B1 | 6/2002 | Mahneke | |
| 6,402,923 B1 | 6/2002 | Mayer et al. | |
| 6,497,801 B1 | 12/2002 | Woodruff et al. | |
| 6,521,102 B1 | 2/2003 | Dordi | |
| 6,527,920 B1 | 3/2003 | Mayer et al. | |
| 6,551,483 B1 | 4/2003 | Mayer et al. | |
| 6,569,299 B1 | 5/2003 | Reid et al. | |
| 6,627,051 B2 | 9/2003 | Berner et al. | |
| 6,632,335 B2 | 10/2003 | Kunisawa et al. | |
| 6,692,588 B1 | 2/2004 | Uzoh et al. | |
| 6,755,954 B2 | 6/2004 | Mayer et al. | |
| 6,773,571 B1 | 8/2004 | Mayer et al. | |
| 6,800,187 B1 | 10/2004 | Reid et al. | |
| 6,821,407 B1 | 11/2004 | Reid et al. | |
| 6,890,416 B1 | 5/2005 | Mayer et al. | |
| 6,919,010 B1 | 7/2005 | Mayer et al. | |
| 6,921,468 B2 | 7/2005 | Graham et al. | |
| 6,964,792 B1 | 11/2005 | Mayer et al. | |
| 7,070,686 B2 | 7/2006 | Contolini et al. | |
| 7,169,705 B2 | 1/2007 | Ide et al. | |
| D544,452 S | 6/2007 | Nakamura et al. | |
| D548,705 S | 8/2007 | Hayashi | |
| D552,565 S | 10/2007 | Nakamura et al. | |
| D553,104 S | 10/2007 | Oohashi et al. | |
| D587,222 S | 2/2009 | Sasaki et al. | |
| 7,622,024 B1 | 11/2009 | Mayer et al. | |
| 7,641,776 B2 | 1/2010 | Nagar et al. | |
| D609,652 S | 2/2010 | Nagasaka et al. | |
| D609,655 S | 2/2010 | Sugimoto | |
| 7,670,465 B2 | 3/2010 | Yang et al. | |
| D614,593 S | 4/2010 | Lee et al. | |
| 7,837,841 B2 | 11/2010 | Chen et al. | |
| 7,854,828 B2 | 12/2010 | Reid et al. | |
| 7,935,240 B2 | 5/2011 | Singh et al. | |
| 7,967,969 B2 | 6/2011 | Mayer et al. | |
| D648,289 S | 11/2011 | Mayer et al. | |
| 8,308,931 B2 | 11/2012 | Reid et al. | |
| 8,475,636 B2 | 7/2013 | Mayer et al. | |
| 8,475,644 B2 | 7/2013 | Mayer et al. | |
| 8,603,305 B2 | 12/2013 | Rash et al. | |
| 8,623,193 B1 | 1/2014 | Mayer et al. | |
| 8,795,480 B2 | 8/2014 | Mayer et al. | |
| 9,309,604 B2 | 4/2016 | Mayer et al. | |
| 9,670,588 B2 | 6/2017 | He | |
| 2001/0050233 A1 | 12/2001 | Uzoh et al. | |
| 2002/0008037 A1* | 1/2002 | Wilson | C25D 17/02 205/157 |
| 2002/0017456 A1 | 2/2002 | Graham et al. | |
| 2002/0020627 A1 | 2/2002 | Kunisawa et al. | |
| 2002/0119671 A1 | 8/2002 | Lee | |
| 2002/0125141 A1 | 9/2002 | Wilson et al. | |
| 2003/0029527 A1 | 2/2003 | Yajima et al. | |
| 2003/0038035 A1 | 2/2003 | Wilson et al. | |
| 2003/0079995 A1 | 5/2003 | Contolini et al. | |
| 2003/0102210 A1 | 6/2003 | Woodruff et al. | |
| 2003/0201166 A1 | 10/2003 | Zheng et al. | |
| 2004/0026257 A1* | 2/2004 | Gonzalez, Jr. | H01L 21/2885 205/157 |
| 2004/0149584 A1 | 8/2004 | Nagai et al. | |
| 2005/0145499 A1 | 7/2005 | Kovarsky et al. | |
| 2006/0000704 A1 | 1/2006 | Sato et al. | |
| 2006/0243598 A1 | 11/2006 | Singh et al. | |
| 2007/0029193 A1 | 2/2007 | Brcka | |
| 2007/0068819 A1 | 3/2007 | Singh et al. | |
| 2007/0238265 A1 | 10/2007 | Kurashina et al. | |
| 2010/0032304 A1 | 2/2010 | Mayer et al. | |
| 2010/0032310 A1 | 2/2010 | Reid et al. | |
| 2010/0044236 A1 | 2/2010 | Mayer et al. | |
| 2010/0116672 A1 | 5/2010 | Mayer et al. | |
| 2011/0031112 A1 | 2/2011 | Birang et al. | |
| 2012/0000786 A1* | 1/2012 | Mayer | C25D 5/08 205/143 |
| 2012/0261254 A1 | 10/2012 | Reid et al. | |
| 2013/0137242 A1 | 5/2013 | He et al. | |
| 2013/0313123 A1 | 11/2013 | Abraham et al. | |
| 2013/0327650 A1 | 12/2013 | Mayer et al. | |
| 2014/0124361 A1 | 5/2014 | Reid et al. | |
| 2014/0326608 A1 | 11/2014 | He | |

(56) References Cited

U.S. PATENT DOCUMENTS

2016/0222535 A1 8/2016 Zhou et al.
2016/0333495 A1 11/2016 Kagajwala et al.

FOREIGN PATENT DOCUMENTS

| CN | 101056718 A | 10/2007 |
|---|---|---|
| CN | 100487855 C | 5/2009 |
| CN | 101736376 A | 6/2010 |
| CN | 101925981 A | 12/2010 |
| CN | 102296344 A | 12/2011 |
| CN | 301883011 S | 4/2012 |
| CN | 102459717 A | 5/2012 |
| CN | 102560612 A | 7/2012 |
| EP | 0037325 | 3/1981 |
| JP | 59-162298 | 9/1984 |
| JP | 09-53197 | 2/1997 |
| JP | 2001-316887 | 11/2001 |
| JP | 2003-268591 | 9/2003 |
| KR | 1020060048645 A | 5/2006 |
| KR | 10-0707121 | 4/2007 |
| KR | 0657600 | 8/2012 |
| TW | 223678 | 11/2004 |
| TW | D148167 | 7/2012 |
| WO | WO99/41434 | 8/1999 |
| WO | WO2005/043593 | 5/2005 |
| WO | WO2010/144330 | 12/2010 |

OTHER PUBLICATIONS

U.S. Final Office Action dated Jul. 25, 2008 issued in U.S. Appl. No. 11/040,359.
U.S. Office Action dated Jan. 8, 2009 issued in U.S. Appl. No. 11/040,359.
U.S. Notice of Allowance dated Jul. 20, 2009 issued in U.S. Appl. No. 11/040,359.
U.S. Office Action dated Oct. 6, 2010 issued in U.S. Appl. No. 12/578,310.
U.S. Notice of Allowance dated Mar. 4, 2011 issued in U.S. Appl. No. 12/578,310.
U.S. Office Action dated Oct. 5, 2012 issued in U.S. Appl. No. 13/110,759.
U.S. Final Office Action dated Mar. 29, 2013 issued in U.S. Appl. No. 13/110,759.
U.S. Notice of Allowance dated Sep. 11, 2013 issued in U.S. Appl. No. 13/110,759.
U.S. Office Action dated Sep. 19, 2011 issued in U.S. Appl. No. 12/291,356.
U.S. Final Office Action dated Feb. 27, 2012 issued in U.S. Appl. No. 12/291,356.
U.S. Notice of Allowance dated Jul. 27, 2012 issued in U.S. Appl. No. 12/291,356.
U.S. Office Action dated Jun. 24, 2011 issued in U.S. Appl. No. 12/481,503.
U.S. Final Office Action dated Mar. 1, 2012 issued in U.S. Appl. No. 12/481,503.
U.S. Office Action dated Jul. 9, 2012 issued in U.S. Appl. No. 12/481,503.
U.S. Final Office Action dated Dec. 19, 2012 issued in U.S. Appl. No. 12/481,503.
U.S. Notice of Allowance dated Mar. 1, 2013 issued in U.S. Appl. No. 12/481,503.
U.S. Office Action dated Jun. 24, 2011 issued in U.S. Appl. No. 12/606,030.
U.S. Final Office Action dated Mar. 1, 2012 issued in U.S. Appl. No. 12/606,030.
U.S. Office Action dated Jun. 28, 2012 issued in U.S. Appl. No. 12/606,030.
U.S. Office Action dated Jul. 13, 2012 issued in U.S. Appl. No. 12/606,030.
U.S. Final Office Action dated Dec. 17, 2012 issued in U.S. Appl. No. 12/606,030.
U.S. Notice of Allowance dated Mar. 1, 2013 issued in U.S. Appl. No. 12/606,030.
U.S. Office Action, dated May 23, 2013, issued in U.S. Appl. No. 13/108,881.
U.S. Final Office Action, dated Oct. 25, 2013, issued in U.S. Appl. No. 13/108,881.
U.S. Notice of Allowance dated Aug. 10, 2011 issued in Design U.S. Appl. No. 29/377,521.
Chinese First Office Action dated May 15, 2013 issued in Application No. 200910209697.2.
Chinese Second Office Action dated Dec. 10, 2013 issued in Application No. 200910209697.2.
PCT International Search Report and Written Opinion dated Jan. 12, 2011 issued in Application No. PCT/US2010/037520.
PCT International Preliminary Report on Patentability and Written Opinion dated Dec. 22, 2011 issued in Application No. PCT/US2010/037520.
Chinese First Office Action dated Nov. 6, 2013 issued in CN 201080032109.3.
Chinese Second Office Action dated Jun. 10, 2014 issued in CN Application No. 201080032109.3.
Taiwan Office Action dated Jul. 31, 2014 issued in TW Application No. 099118603.
Chinese Office Action dated Jul. 19, 2011 issued in Application No. 201130081716.6.
TW Office Action dated Nov. 28, 2011 issued in Application No. 100301923.
KR Office Action dated Apr. 20, 2012 issued in Application No. 2011-0012881.
Fang et al. (2004) "Uniform Copper Electroplating on Resistive Substrates," Abs. 167, 205$^{th}$ Meeting, *The Electrochemical Society, Inc.*, 1 page.
Malmstadt et al. (1994) "Microcomputers and Electronic Instrumentation: Making the Right Connections," *American Chemical Society*, p. 255 (3pp).
"Release of Sabre™electrofill tool with HRVA by Novellus Systems, Inc." no earlier than Aug. 2005. (3 pp.).
U.S. Office Action dated Aug. 26, 2016 issued in U.S. Appl. No. 14/251,1083.
U.S. Notice of Allowance dated Feb. 3, 2017 issued in U.S. Appl. No. 14/251,108.
U.S. Notice of Allowance [Corrected Notice of Allowability] dated May 10, 2017 issued in U.S. Appl. No. 14/251,108.
U.S. Office Action dated Feb. 23, 2017 issued in U.S. Appl. No. 14/712,553.
U.S. Office Action dated Jul. 29, 2015 issued in U.S. Appl. No. 13/907,265.
U.S. Notice of Allowance dated Dec. 30, 2015 issued in U.S. Appl. No. 13/907,265.
U.S. Office Action, dated Oct. 22, 2015, issued in 14/153,582.
U.S. Office Action, dated May 9, 2016, issued in U.S. Appl. No. 14/153,582.
U.S. Office Action, dated Dec. 2, 2016, issued in U.S. Appl. No. 14/153,582.
Chinese First Office Action dated Jan. 29, 2016 issued in Application No. CN 201410183216.6.
Chinese Second Office Action dated Sep. 27, 2016 issued in Application No. CN 201410183216.6.
Chinese Second Third Action dated Mar. 28, 2017 issued in Application No. CN 201410183216.6.
Korean First Office Action dated Jun. 23, 2016 issued in Application No. KR 102012-7000614.
Chinese First Office Action dated Jul. 20, 2015 issued in Application No. CN 201210108100.7.
Chinese Second Office Action dated Feb. 25, 2016 issued in Application No. CN 201210108100.7.
Taiwan Office Action dated Jan. 20, 2016 issued in Application No. TW 101113319.
U.S. Appl. No. 15/583,592, filed May 1, 2017, He.

* cited by examiner

CONTROL OF ELECTROLYTE FLOW DYNAMICS FOR UNIFORM ELECTROPLATING

FIELD OF THE INVENTION

The embodiments disclosed herein pertain to apparatus and methods for electrodepositing metals, such as copper on semiconductor substrates.

BACKGROUND

In integrated circuit manufacturing, a conductive material, such as copper, is often deposited by electroplating onto a seed layer of metal to fill one or more recessed features on the semiconductor wafer substrate. Electroplating is a method of choice for depositing metal into the vias and trenches of the wafer during damascene processing, and is also used to fill Through-Silicon Vias (TSVs), which are relatively large vertical electrical connections used in 3D integrated circuits and 3D packages.

During electroplating, electrical contacts are made to the seed layer (e.g., a conformally deposited copper layer) at the periphery of the wafer, and the wafer is electrically biased to serve as a cathode. The wafer is brought into contact with an electroplating solution, which contains ions of metal to be plated and an acid that provides sufficient conductivity to the electroplating solution. The plating solutions may also contain additives, known as accelerators, suppressors, and levelers that modulate electrodeposition rates on different surfaces of the substrate. Electroplating is typically conducted for an amount of time that is sufficient to fill the recessed features with metal. Then, the unwanted metal deposited on the field regions of the wafer is removed in a planarization operation, such as by a chemical mechanical polishing (CMP).

One of the problems encountered during electroplating is non-uniform distribution of thickness of electrodeposited metal along the radius of the circular semiconductor wafer. This type of non-uniformity is known as radial non-uniformity. Radial non-uniformity may occur due to a variety of factors, such as due to a terminal effect, and due to variations in electrolyte flow at the surface of the substrate. Terminal effect manifests itself in edge-thick electroplating, because the potential in the vicinity of the electrical contacts at the edge of the wafer can be significantly higher than at the center of the wafer, particularly if a thin resistive seed layer is used. An ionically resistive ionically permeable plate positioned in the proximity of the wafer substrate can mitigate the terminal effect. The plate is typically made of a resistive material and includes a plurality of channels through which the electrolyte is transported towards the wafer substrate. The plate introduces an additional resistance into the plating cell which leads to reduction of terminal effect. This plate can also serve as a flow-shaping element for distributing the flow of electrolyte. In a conventional system the flow-shaping element includes a large number of uniformly distributed isolated channels of the same size. The channels are perpendicular to the plating face of the wafer substrate and provide an impinging flow of electrolyte to the substrate.

SUMMARY

One of the problems encountered during electroplating in an apparatus having a flow-shaping element with channels that are perpendicular to the plating surface of the substrate, is radial non-uniformity that stems from different local fluidic environments at the center and edge portions of the rotating substrate. For example, the flow of electrolyte at the edge of a rotating wafer is typically more turbulent than at the center. Further, portions of the substrate located at the edge of a rotating wafer would have a smaller time average exposure to the channels of the flow-shaping element than certain portions located in the center of a rotating wafer, leading to localized rings of increased thickness of electroplated metal in the central portion of the substrate. These problems are addressed herein in some embodiments by providing an apparatus having a flow-shaping element which has at least two populations of channels with different angle of incline to the plating face of the substrate.

In a first aspect of the invention, an electroplating apparatus is provided, wherein the apparatus includes: (a) a plating chamber configured to contain an electrolyte and an anode while electroplating metal onto a substantially planar substrate; (b) a substrate holder configured to hold the substantially planar substrate such that a plating face of the substrate is separated from the anode during electroplating; (c) a flow-shaping element comprising a substrate-facing surface and an opposing surface, the flow-shaping element comprising an ionically resistive material (e.g., a disc made of a polymer that introduces resistance to ionic current in the plating bath) with a plurality of non-communicating channels made through the flow-shaping element, wherein said non-communicating channels allow for transport of the electrolyte through the flow-shaping element during electroplating from the opposing surface to the substrate-facing surface of the flow-shaping element, wherein the channels comprise a first plurality of channels that are not perpendicular to a plane defined by the plating face of the substrate (referred to as "non-perpendicular channels") and a second plurality of channels that are perpendicular to the plane defined by the plating face of the substrate (referred to as "perpendicular channels"). The first and second pluralities of channels are preferably substantially segregated on the flow-shaping elements based on location, rather than randomly mixed throughout the flow-shaping element. Such distribution of channels on the flow-shaping element is referred to as substantial spatial segregation. The channels are substantially spatially segregated, when the area occupied by non-perpendicular channels (referring to the area of the substrate-facing surface of the flow-shaping element) contains 80% or more of non-perpendicular channels and 20% or less of perpendicular channels (such as no perpendicular channels). In one example, the selected area at the center of the flow-shaping element contains only non-perpendicular channels, whereas the remaining area surrounding the center contains only perpendicular channels.

In some embodiments the channels that are not perpendicular to the plane defined by the plating face of the substrate are directed at an angle of between about 30-75 degrees to the plane defined by the plating face of the substrate.

In some embodiments, the first plurality of channels that are not perpendicular to the plane defined by the plating face of the substrate are located in a central portion of the flow-shaping element and are surrounded by the second plurality of channels that are perpendicular to the plane defined by the plating face of the substrate.

The plurality of non-perpendicular channels in the central portion of the substrate may occupy regions of a variety of shapes. In one example the first plurality of channels occupy a generally rectangular region in a central portion of the flow-shaping element. In another example the first plurality of channels occupies a generally circular region in the central portion of the flow-shaping element.

In some embodiments, particularly when the first plurality of channels is in the central portion, the number of such non-perpendicular channels is only a small fraction of the total number of channels. In some embodiments the flow-shaping element comprises between about 6,000-12,000 channels, and the non-perpendicular channels are between about 0.5-2% of the total number of channels.

In some embodiments the first plurality of channels that are not perpendicular to the plane defined by the plating face of the substrate are located in a peripheral portion of the flow-shaping element and surround the second plurality of channels that are perpendicular to the plane defined by the plating face of the substrate. The first plurality of channels, in some implementations of this embodiment, occupies a generally annular region.

In some embodiments, the channels from the first plurality of channels have larger diameters than the channels from the second plurality of channels.

The flow-shaping element, in some embodiments is a planar disk, having upper and lower surfaces that are parallel to the plating surface of the wafer substrate. In another embodiment, the substrate-facing surface of the flow-shaping element is convex.

The flow-shaping element is typically positioned in a close proximity of the substrate. For example, in some implementations the substrate-facing surface of the flow-shaping element is separated from the plating face of the substrate by a distance of about 10 millimeters or less during electroplating. For example, in some implementations, this separation distance is 5 mm or less. The distance refers to the smallest distance between the substrate and the flow-shaping element, if the substrate-facing surface of the flow-shaping element is not flat.

In some embodiments, the apparatus further includes one or more tubes configured to distribute the electrolyte within the electroplating apparatus, wherein the tubes are positioned between the anode and the flow-shaping element. In some embodiments each tube has a plurality of openings in its wall distributed to provide uniform flow of electrolyte to the central and peripheral portions of the plating chamber. In other embodiments the openings in each tube are distributed such as to provide a greater flow of electrolyte to a central portion of the plating chamber than to a peripheral portion of the plating chamber. In other embodiments the openings in each tube are distributed such as to provide a greater flow of electrolyte to a peripheral portion of the plating chamber than to the central portion of the plating chamber.

In a second aspect of the invention a method of electroplating metal (e.g., copper) on a substrate comprising a plurality of recessed features, is provided. The method includes: (a) providing the substrate to a plating chamber configured to contain an electrolyte and an anode while electroplating metal onto the substrate, wherein the plating chamber includes: a substrate holder holding the substrate such that a plating face of the substrate is separated from the anode during electroplating, and a flow-shaping element shaped and configured to be positioned between the substrate and the anode during electroplating, the flow-shaping element comprising an ionically resistive material with a plurality of non-communicating channels made through the flow-shaping element, wherein said non-communicating channels allow for transport of the electrolyte through the flow-shaping element during electroplating, wherein the channels comprise a first plurality of channels that are not perpendicular to a plane defined by the plating face of the substrate (e.g., directed at between about 35-75 degrees) and a second plurality of channels that are perpendicular to the plane defined by the plating face of the substrate, wherein the first and second pluralities of the channels are substantially spatially segregated; and (b) electroplating a metal onto the substrate plating surface while rotating the substrate and while flowing the electrolyte into the electroplating chamber in the direction of the substrate plating face through the channels of the flow-shaping element. The electroplating apparatus used in this method can include any of the features described herein.

The method can be used for electrodepositing metals in many types of recessed features, but is particularly useful for electrodepositing metal into Damascene features having widths of less than about 100 nm.

In some implementations of the electroplating method, electroplating involves several steps, where different levels of power (e.g., by providing different levels of current and/or potential) are applied to the electroplating apparatus (e.g., the cathodically biased substrate and the anode), different rotation rates are used for rotating the substrate, and different electrolyte flow rates are utilized. In one implementation, a particularly pronounced reduction in non-uniformity is observed in a method which involves: (i) electrodepositing copper while providing a first level of power to the electroplating apparatus; (ii) reducing power to about zero, and allowing the substrate to rotate at a rate of at least about 200 rpm while substantially no power is applied; (iii) continue electrodepositing copper at a second power level after increasing the power provided to the plating cell from about zero to the second power level, wherein the second power level is greater than the first power level, and wherein the electroplating comprises providing electrolyte to the plating cell at a lower rate during (i) than during (iii).

The methods provided herein can be integrated into the processes that involve photolithographic patterning. In some embodiments the methods further include: applying photoresist to the wafer substrate; exposing the photoresist to light; patterning the photoresist and transferring the pattern to the wafer substrate; and selectively removing the photoresist from the wafer substrate.

In another aspect of the invention, an apparatus for electroplating metal is provided, wherein the apparatus includes: (a) a plating chamber configured to contain an electrolyte and an anode while electroplating metal onto a substantially planar substrate; (b) a substrate holder configured to hold the substantially planar substrate such that a plating face of the substrate is separated from the anode during electroplating; and (c) a controller comprising program instructions and/or logic for performing any of the methods provided herein.

In another aspect of the invention, a system is provided, wherein the system includes an electroplating apparatus provided herein and a stepper.

In another aspect of the invention, a non-transitory computer machine-readable medium comprising program instructions is provided. The program instructions for control of an electroplating apparatus comprise code for performing any of the methods described above. For example, the program instructions may include code for: (i) electrodepositing copper while providing a first level of power to the electroplating apparatus; (ii) reducing power to about zero, and allowing the substrate to rotate at a rate of at least about 200 rpm while no power is applied; (iii) continue electrodepositing copper at a second power level after increasing the power provided to the plating cell from about zero to the second power level, wherein the second power level is greater than the first power level, and wherein the electroplating comprises providing electrolyte to the plating cell at a lower rate during (i) than during (iii).

These and other features and advantages of the present invention will be described in more detail with reference to the figures and associated description that follows.

BRIEF DESCRIPTION OF THE DRAWINGS

FIG. 2D is a plot illustrating the dependence of electroplated thickness range in the center of the wafer substrate on the rate of electrolyte delivery for a process with a pause in plating current and a constant rate of electrolyte delivery (curve (a)), and for a process with a pause in plating current and with low rate of electrolyte delivery during low power steps (curve (b)).

DETAILED DESCRIPTION

Figure 1A:
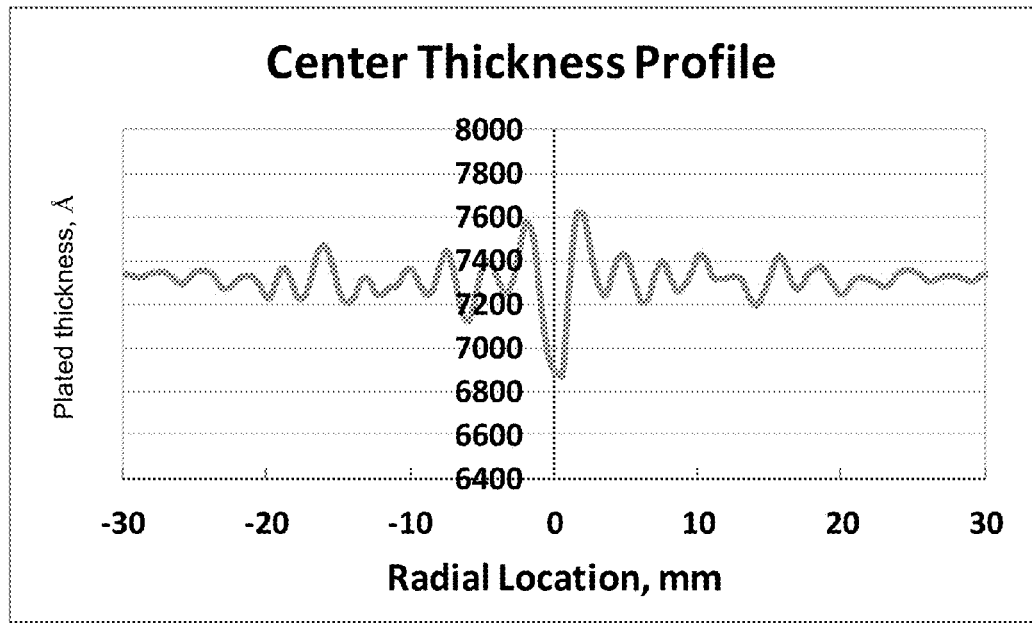
FIGS. 1A-1C are experimental plots illustrating different types of radial non-uniformity.

In the following description, the invention is presented in terms of certain specific configurations and processes to help explain how it may be practiced. The invention is not limited to these specific embodiments. Examples of specific embodiments of the invention are illustrated in the accompanying drawings. While the invention will be described in conjunction with these specific embodiments, it will be understood that it is not intended to limit the invention to such specific embodiments. On the contrary, it is intended to cover alternatives, modifications, and equivalents as may be included within the scope and equivalents of the appended claims. In the following description, numerous specific details are set forth in order to provide a thorough understanding of the present invention. The present invention may be practiced without some or all of these specific details. In other instances, well known process operations have not been described in detail in order not to unnecessarily obscure the present invention.

The methods and apparatus provided herein can significantly improve the radial uniformity of electroplating. The uniformity is typically quantified by measuring the range of thickness of electrodeposited metal across the diameter of the wafer substrate or across local (e.g., central) portion of the diameter if local uniformity is discussed. In some embodiments, the range of thickness variation across the wafer substrate is less than about 5%, such as less than about 3% of the total thickness of electrodeposited layer. For example, in some embodiments the thickness range variation is less than about 300 Å, such as less than about 200 Å for a total plating of 7000 Å. In some embodiments metal layers having a thickness of between about 0.7-1 μm are electrodeposited with a thickness variation range of less than about 200 Å across the diameter of the semiconductor wafer.

The methods and apparatus presented herein can be used with a wide range of electrolytes, but are particularly valuable for electrodeposition from dilute electrolytes, where mass transfer of electrolyte plays a prominent role in shaping the thickness profile. For example, the methods and apparatus are particularly useful for electroplating copper using electrolytes containing cupric ions at a concentration of less than about 10 g/L, such as less than about 5 g/L. The methods are not limited to electrodeposition from dilute solutions, and generally can be used in deposition of copper from a variety of electrolytes, e.g., electrolytes with cupric ion concentrations of between about 0.1 g/L-70 g/L. Provided methods can be used for electrodeposition of copper (which includes pure copper and copper alloys), and other metals, such as nickel, silver, and tin, including their alloys.

Further, the methods and apparatus presented herein are particularly useful for but are not limited to electroplating which involves delivery of electrolytes to the electroplating chamber at high flow rates, such as at flow rates of at least about 15 liters per minute (lpm), or at least about 20 liters per minute. The methods and apparatus presented herein are capable, in some embodiments, of mitigating uniformity problems that arise at such high rates of delivery. It is noted that in some embodiments (such as those illustrated by experimental examples provided herein), the apparatus includes a catholyte portion containing the wafer cathode, and an anolyte portion containing the anode, wherein the catholyte and anolyte portions are separated by an ion-permeable membrane, wherein the anolyte and catholyte portions have separate electrolyte inlets and outlets (e.g., anolyte can be recirculated in an anolyte recirculation loop, while catholyte is separately provided to the catholyte portion of the electroplating apparatus). In these embodiments (and in all experimental examples provided herein) the electrolyte delivery rate (also referred to as pump rate) refers only to the rate of delivery of catholyte to the catholyte portion, and does not include the rate of delivery of anolyte to the anolyte portion.

In addition, in some embodiments, electroplating methods and apparatus presented herein are capable of addressing uniformity problems that are observed when the substrate is rotated at a very high rate during electroplating. For example, provided methods are useful at improving plating uniformity for electroplating that involves rotating the substrate at a rate of at least about 150 rotations per minute (rpm), such as at least about 180 rpm. While the methods can be used at a variety of substrate rotation rates, they are particularly useful for addressing the imbalances in electrolyte flow between the central portion of the substrate and the peripheral portion of the substrate, when the substrate rotates at a high rate. The peripheral portion of the rotating substrate is experiencing a more turbulent electrolyte flow than the central portion of the substrate, because of its higher linear speed, and this discrepancy may lead to an increase in radial non-uniformity during electroplating.

In all configurations of the apparatus provided herein, the apparatus includes an ionically resistive, ionically permeable flow-shaping element positioned in a close proximity of the substrate in the plating chamber. This allows for free flow and transport of electrolyte though the element, but introduces a significant ionic resistance into the plating system, and may improve center-to-edge (radial) uniformity due to mitigation of the terminal effect. The ionically resistive ionically permeable flow-shaping element further serves as a source of electrolyte flow that exits the element in a direction that is determined by the orientation of the channels within the element. When the channels are perpendicular to the plating face of the substrate, an impinging flow of electrolyte results. When the channels are not perpendicular to the plating face of the substrate, the flow of electrolyte would have a transverse (lateral) component. The channels are distinct from the 3-D porous structures, since they do not ionically communicate within the body of the flow-shaping element.

Two features of the flow-shaping element are notable: the placement of the element in close proximity with respect to the substrate, and a relatively high number of channels with a small diameter. An example of a flow-shaping element is a disc or a convex plate made of an ionically resistive material, such as polyethylene, polypropylene, polyvinylidene difluoride (PVDF), polytetrafluoroethylene, polysulphone, polyvinyl chloride (PVC), polyethyleneterephthalate (PET), poly(p-phenylene sulfide) (PPS), polycarbonate, and the like, having between about 6,000-12,000 through-holes (channels). The disc, in many embodiments, is substantially coextensive with the wafer (e.g., has a diameter of about 300 mm when used with a 300 mm wafer or 400 mm when used with a 400 mm wafer) and resides in close proximity of the wafer, e.g., just below the wafer in a wafer-facing-down electroplating apparatus. Preferably, the plated surface of the wafer resides within about 10 mm, more preferably within about 5 mm of the closest surface of the flow-shaping element.

The presence of a resistive but ionically permeable element close to the substrate substantially reduces the impact of and compensates for the terminal effect and improves radial plating uniformity. It also simultaneously provides the ability to have a substantially spatially-uniform impinging flow of electrolyte directed upwards at the wafer surface by acting as a flow diffusing manifold plate. Importantly, if the same element is placed farther from the wafer, the uniformity of ionic current and flow improvements become significantly less pronounced or non-existent.

Another important feature of the flow-shaping element structure is the diameter or principal dimension of the through-holes and its relation to the distance between the flow-shaping element and the substrate. Preferably the diameter of each perpendicular through-hole (or of majority of perpendicular through-holes), should be no more than the distance from the plated substrate surface to the closest surface of the flow-shaping element. Thus, the diameter or principal dimension of the perpendicular through holes should not exceed 5 mm, when flow-shaping element is placed within about 5 mm of the plated wafer surface. The non-perpendicular holes in many embodiments have a diameter that is greater than the diameter of the perpendicular holes in order to maintain the same resistivity (due to a longer fluid path). In some embodiments the diameter of the non-perpendicular holes is between about 1.1-1.5 times greater than the diameter of the perpendicular holes, and depends on the angle of incline of the non-perpendicular channels.

In some embodiments the flow-shaping element has a top substrate-facing surface that is parallel to the plated surface of the substrate. In other embodiments, the top surface of the flow-shaping element is concave or convex. In a convex flow-shaping element the distance from the substrate to the substrate-facing surface of the flow-shaping element is smaller at the center than at the edge. In a concave flow-shaping element the distance from the substrate to the substrate-facing surface of the flow-shaping element is greater at the center than at the edge.

Figure 1B:
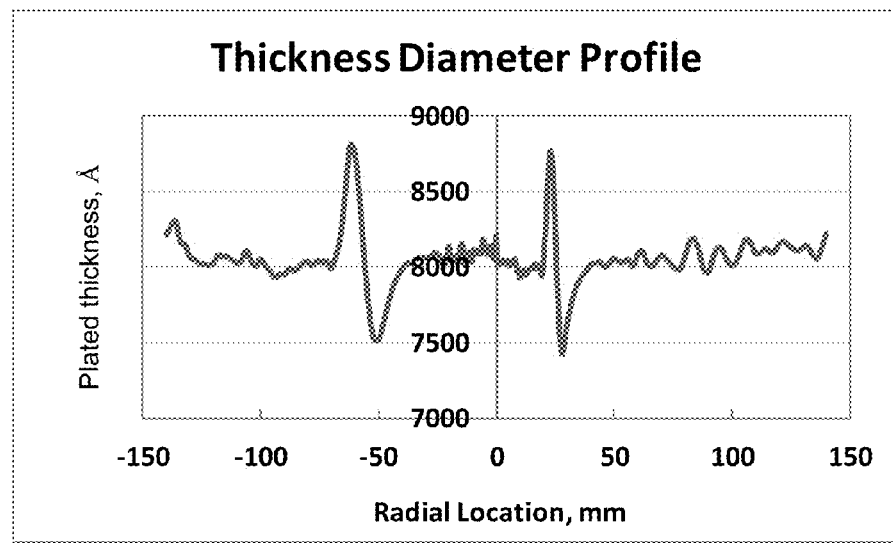
Figure 1C:
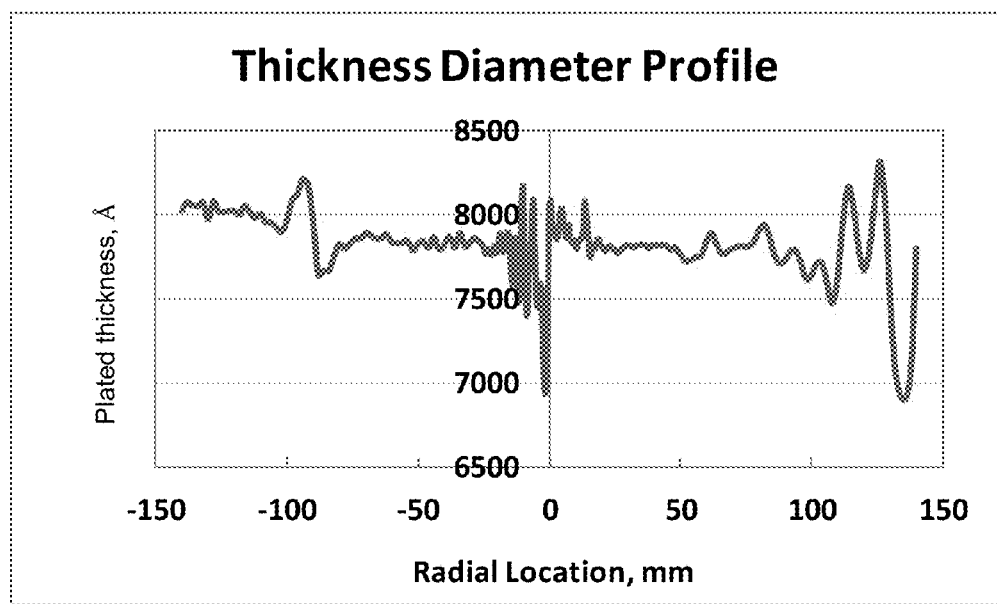

FIGS. 1A-1C illustrate several types of radial non-uniformity defects that are encountered during electrodeposition of copper layers with a conventional flow-shaping element. In all three cases electroplating was performed in an electroplating apparatus equipped with a flow-shaping element positioned in the proximity of the substrate, wherein the flow-shaping element was a disk made of an ionically resistive material having a plurality of non-communicating through holes where all of the channels were perpendicular to the plating face of the substrate and were configured to transport the electrolyte towards the substrate. In all three cases electroplating was performed using an electrolyte containing cupric ions at a concentration of 5 g/L.

FIG. 1A illustrates one type of non-uniformity defects encountered during electroplating with a flow-shaping element. FIG. 1A is a plot illustrating the thickness of deposited copper as a function of radial distance in the central portion of the wafer (along a 30 mm of radial distance). In this example electroplating was conducted at a relatively lower plating current (15 A), lower rotational speed (120 rpm), and high electrolyte flow rate (20 lpm). It can be seen that the thickness oscillates in this portion of the wafer exhibiting alternating regions of high and low thickness. This defect is visually observed on the wafer as concentric rings and is attributed to a "jetting effect", in which the channels of the flow-shaping element act as jets of electrolyte and project the image of the holes onto the rotating wafer. Because the average time of exposure to these jets in the center of the rotating wafer is greater than at the outer portion of the wafer, the regions of the wafer directly above the holes in the center will exhibit excessively high thickness of plating.

FIG. 1B illustrates another type of radial non-uniformity defect in copper electroplating. These defects were observed when higher plating current (25 A) and higher substrate rotation speed (300 rpm) were used with the same electrolyte delivery rate of 20 lpm. FIG. 1B is a plot illustrating thickness of deposited copper as a function of radial distance across an entire 300 mm wafer. It can be seen that a large spike in thickness variation occurs at a radial distance of about 25 mm on the wafer, which manifests itself as a halo when the wafer is visually observed. This type of defect is typically observed when the plating process is running near the limiting current.

FIG. 1C illustrates another type of radial non-uniformity defect in copper electroplating, which was observed when electroplating using high plating current (25 A), high substrate rotational speed (300 rpm), and high electrolyte flow rate (30 lpm). FIG. 1C is a plot illustrating thickness of deposited copper as a function of radial distance across an entire 300 mm wafer. In this case the spike in thickness occurs closer to the edge of the wafer substrate, at a radial distance of about 100 mm. This defect visually manifests itself as a halo in the peripheral region of the wafer substrate.

An electroplating apparatus that is capable of improving radial non-uniformity, particularly non-uniformity resulting from different fluidic environments at the center and edge portions of a rotating wafer substrate is provided. The apparatus includes a plating chamber configured to contain an electrolyte and an anode; a substrate holder configured to hold and rotate the substantially planar substrate such that a plating face of the substrate is separated from the anode during electroplating; and a flow-shaping element comprising a substrate-facing surface and an opposing surface, the flow-shaping element comprising an ionically resistive material with a plurality of non-communicating channels made through the flow-shaping element, wherein the non-communicating channels allow for transport of the electrolyte through the flow-shaping element during electroplating from the opposing surface to the substrate-facing surface of the flow-shaping element, wherein the channels comprise a group of channels that are not perpendicular to a plane defined by the plating face of the substrate and another group of channels that are perpendicular to the plane defined by the plating face of the substrate. The two groups of channels are substantially spatially segregated, such that a selected area of the flow-shaping element contains exclusively or predominantly channels of one type (e.g. non-perpendicular channels in the center).

Figure 2A:
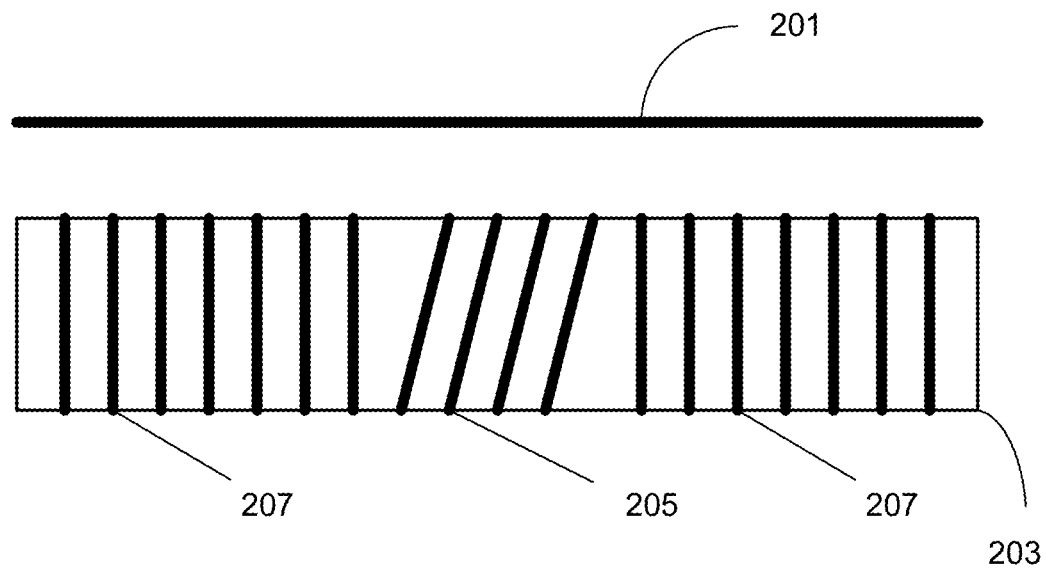
FIG. 2A is a schematic simplified cross-sectional presentation of a wafer substrate and a flow-shaping element in accordance with an embodiment presented herein.

The flow-shaping element and the plating surface of the wafer substrate are schematically illustrated in FIG. 2A. This is a simplified cross-sectional view of the flow-shaping element having a plurality of through channels. It is understood that schematic drawings are not drawn to scale and are simplified to maintain clarity. In a typical flow-shaping element the number of through channels is substantially greater than shown in this illustration. In the illustrated embodiment, the plating face of the wafer 201 is substantially planar and is located above the flat flow-shaping element 203. The flow-shaping element has a group of channels 205, which are not perpendicular to the plane defined by the plating face of the wafer, and a group of channels 207, which are perpendicular to the plane defined by the plating face of the wafer. In the illustrated embodiment the group of non-perpendicular channels is located in the central portion of the flow-shaping element and is surrounded by the group of perpendicular channels. The channels are substantially spatially segregated, as the region occupied by the non-perpendicular channels does not contain any perpendicular channels in this embodiment.

Figure 2B:
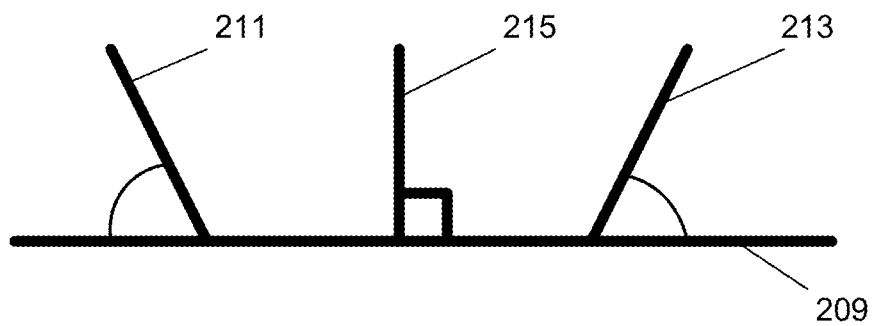
FIG. 2B is a schematic cross-sectional view of different types of possible channels in a flow-shaping element, illustrating the determination of angles of incline for each type of channel.

FIG. 2B illustrates the determination of incline angles that are used to define the channels. Channel 215 is perpendicular to the plane defined by the plating face of the substrate 209. Channels 211 and 213 are channels that are not perpendicular to the plane defined by the plating face of the substrate 209 (the parallel plane is used in this illustration). The channels may be inclined in opposite directions, as channels 211 and 213, but in both cases the acute angle at the intersection of each channel with plane 209 is used for the purposes of the incline angle determination. This angle, in the preferred embodiments should be between about 30-75 degrees. In a specific example, the angle of incline is about 45 degrees. The direction of the incline of the channels is not critical for many of the embodiments presented herein. In many embodiments all non-perpendicular channels are inclined in one direction. In some embodiments, the incline angle and the direction of incline in the group of non-perpendicular channels is the same for all non-perpendicular channels. In other embodiments the group of non-perpendicular channels may have differing angles of incline and/or differing directions of incline. The direction of incline is determined by treating the channel as a vector directed to the substrate-facing surface of the flow-shaping element and originating from the opposite surface. The projection of this vector onto the horizontal plane is used to characterize the direction of the channel. For example, in some cases the projection is parallel to the radius of the flow-shaping element (drawn at the location of the channel). Such channels are referred to as radially directed channels and me be directed towards the center of the flow-shaping element or away from it. In other cases the projection is parallel to the tangent to the flow-shaping element (drawn at the point on the edge of the flow-shaping element that is closest to the channel). Such channels are referred to as tangentially-directed channels, and generally can be directed either in the same or opposite direction as the direction of the wafer substrate rotation. In other cases, the projection of the channel is not parallel either to the radius or to the tangent.

The preferred location for the group of non-perpendicular channels depends on the type of non-uniformity that is targeted. In some embodiments the group of non-perpendicular channels is located in the central portion of the flow-shaping element, while the remaining channels are perpendicular channels. In other embodiments, the group of non-perpendicular channels is located in the peripheral portion of the flow-shaping element, while the rest of the channels are perpendicular channels.

Figure 3:
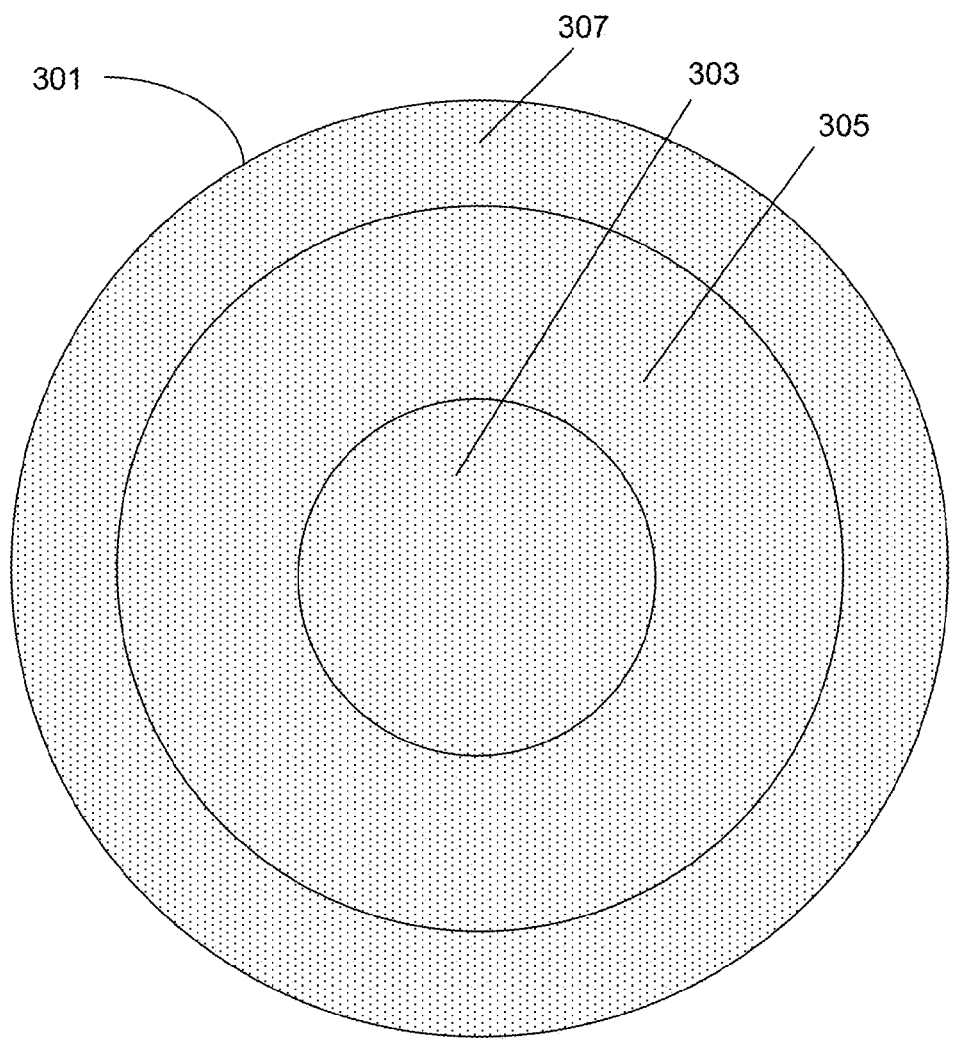
FIG. 3 is a schematic top view of a flow-shaping element, illustrating central, middle and peripheral portions of the flow-shaping element.

FIG. 3A illustrates a schematic top view of a flow-shaping element 301, divided into the central portion 303, middle portion 305, and peripheral portion 307. The central portion is an inner circular portion of the element having a radius that is about 30% of the radius of the entire flow-shaping element. The peripheral portion is an outer annular portion of the flow-shaping element, having a width that is about 30% of the radius of the flow-shaping element. The remaining annular portion between the central and peripheral regions is a middle portion that has a width of 40% of the radius of the flow-shaping element. For example for a flow-shaping element having a radius of 150 mm, the inner circular portion with the radius of 45 mm corresponds to the central portion, the outer annular portion having a width of 45 mm corresponds to the peripheral portion and the remaining annular portion between the central and peripheral portions having a width of 60 mm is the middle portion of the flow-shaping element.

It is understood that non-perpendicular channels do not need to occupy the entirety of the central portion of the flow-shaping element. In some embodiments, the non-perpendicular channels are localized directly around the center (e.g., within a central area defined by about 5% or 10% of the radius of the flow-shaping element). In some embodiments, only a small fraction of channels are non-perpendicular channels. For example, in some embodiments the flow-shaping element has between about 0.5-2% of non-perpendicular channels to the total number of channels. Such small fraction of non-perpendicular channels is typically sufficient to reduce the non-uniformity defects, particularly when the non-perpendicular channels are located in the central portion of the flow-shaping element. When the non-perpendicular channels are located in the peripheral portion of the flow-shaping element they may constitute up to 20% of the total number of channels in some embodiments.

Figure 4A:
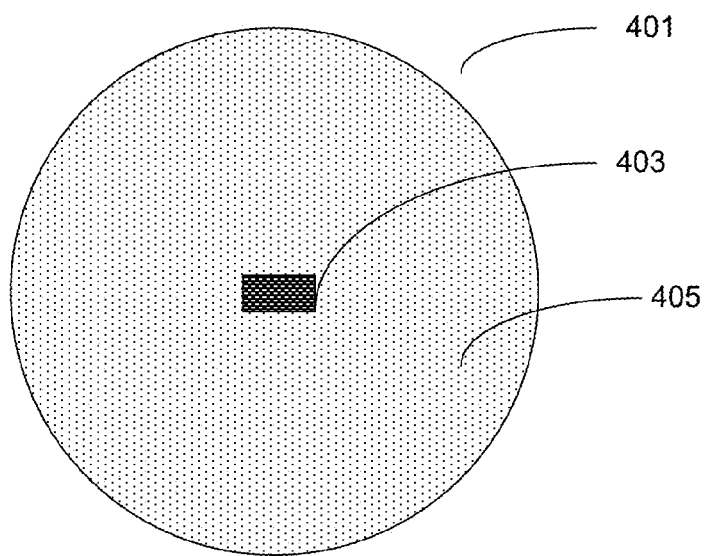
FIGS. 4A-4C are schematic top views of flow-shaping elements in accordance with different embodiments provided herein, illustrating spatially segregated regions of perpendicular and non-perpendicular channels.

The non-perpendicular channels can occupy regions having a variety of shapes in the central portion of the flow-shaping element, such as a generally rectangular region (e.g. a rectangle of 5×15 channels), a generally square region, a generally circular region, etc. In some embodiments, the use of a generally rectangular region for non-perpendicular channels is preferred, because due to its lower symmetry in comparison with a circular or a square region, its use results in the most pronounced redistribution of electrolyte flow and greatest reduction in non-uniformity. FIG. 4A illustrates a schematic top view of a flow-shaping element 401 having a rectangular region 403 of non-perpendicular channels in the central portion of the flow-shaping elements surrounded by perpendicular channels 405. In various embodiments central rectangles having dimensions of 5 by 15 channels (75 non-perpendicular channels total) and 5 by 9 channels (45 channels total), wherein the channels have an incline angle of 45 degrees were successfully used to improve uniformity in a flow-shaping element having a total of about 9,000 channels.

Figure 4B:
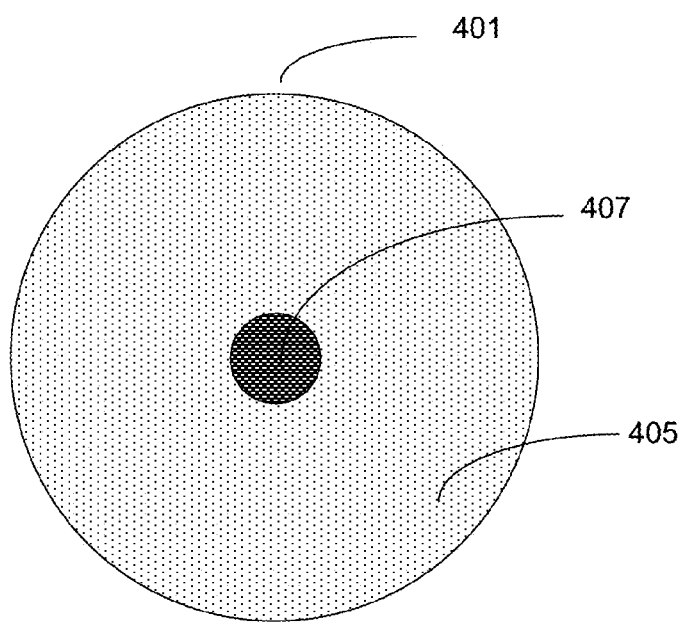

FIG. 4B illustrates a schematic top view of a flow-shaping element 401 having a circular region 407 of non-perpendicular channels in the central portion of the flow-shaping elements surrounded by perpendicular channels 405.

Figure 4C:
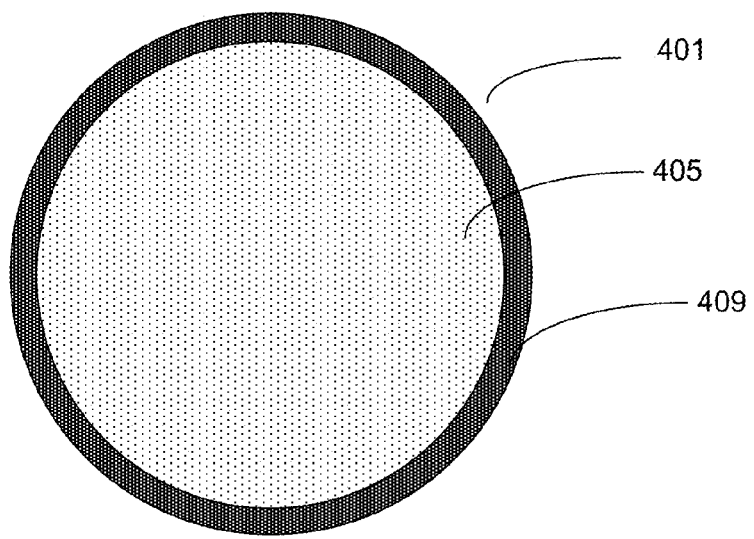

In other embodiments the non-perpendicular channels are located at the peripheral portion of the flow-shaping element and surround the region with perpendicular channels. This embodiment is illustrated in FIG. 4C, which shows an annular region 409 occupied by non-perpendicular channels at the peripheral portion of the flow-shaping element 401, where the annular region 409 surrounds region 405 occupied by perpendicular channels. Introduction of non-perpendicular channels at the peripheral portion of the flow-shaping element provides additional control over the direction of electrolyte flow and allows to modulate flow rate of the electrolyterelative to the plating substrate, which is usually rotated at a high speed. Therefore, this embodiment is useful for modulating the turbulence at the near edge of the substrate.

Figure 4D:
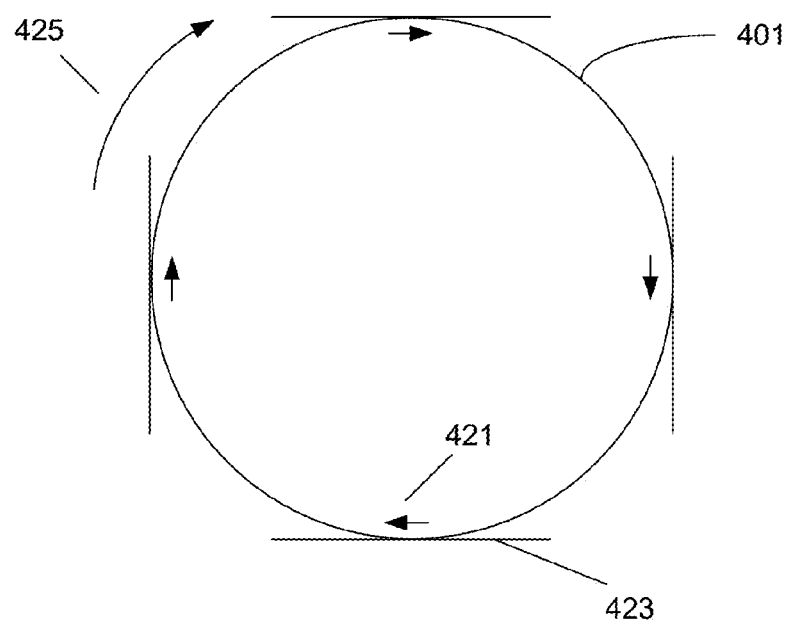
FIG. 4D is a schematic presentation of a top view of a flow-shaping element having tangentially directed non-perpendicular channels in the peripheral portion of the flow-shaping element.
Figure 4E:
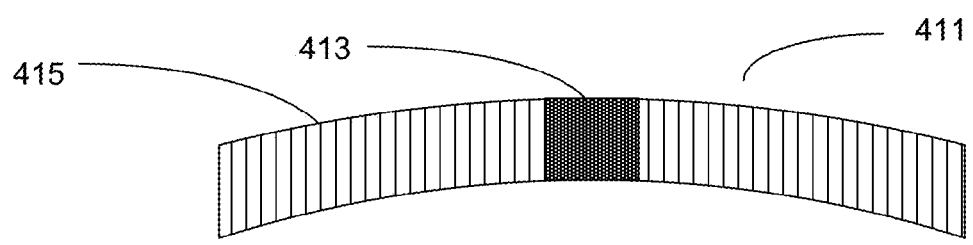
FIG. 4E is a schematic cross-sectional view of a convex flow-shaping element having a spatially segregated region of non-perpendicular channels in the central portion of the flow-shaping element.

In some embodiments, the non-perpendicular channels can be used over the entire annular peripheral portion of the flow-shaping element, having a width of about 30% the radius of the flow-shaping element. In one embodiment the non-perpendicular channels are used in an outer annular region of the flow-shaping element having a width of about ⅓ of the radius of the flow-shaping element. In this example, if the flow-shaping element has a radius of 150 mm, the outer annular region of the non-perpendicular channels has a width of 50 mm (between 100 mm and 150 mm radial positions). More commonly, the width of the outer annular region of non-perpendicular elements is between about ¹⁄₃₀ to ⅕ of the radius of the flow-shaping element. In these embodiments the number of non-perpendicular channels in the flow-shaping element is between about 5-40% of the total number of channels. When the non-perpendicular channels are used in the peripheral portion of the flow-shaping element (similarly to the case when they are used in the center), their direction can be the same for all of the non-perpendicular channels, or two or more different directions can be used. Generally, the channels can be radially directed, tangentially directed, or neither radially nor tangentially directed. In one embodiment, the channels in the peripheral portion of the flow-shaping element are tangentially directed, such that the electrolyte flow coming out of the channels has a horizontal component that is flowing in the same direction as the direction of rotation of the wafer substrate. This orientation can reduce the relative speed between the plating solution and the wafer substrate, and thus reduce the turbulence the wafer experiences at the near edge region. As a result, such configuration can reduce the turbulence difference between the center and the edge, leading to relatively more uniform plating across the whole wafer substrate. This embodiment is illustrated in FIG. 4D which illustrates the direction of four non-perpendicular channels at the periphery of the flow-shaping element (perpendicular channels and other non-perpendicular channels are not shown to preserve clarity). The flow-shaping element 401 contains a plurality of non-perpendicular channels in its peripheral portions where the directions 421 of the four illustrative channels are shown to be parallel to the closest tangents 423 drawn to the flow-shaping element. The direction of rotation of the wafer is schematically shown by arrow 425 and is the same as the direction of the channels.

The non-perpendicular channels (either in the peripheral or central portion of the flow-shaping element), typically have diameters that are similar to or smaller than the distance between the substrate and the flow-shaping element (e.g., less than about 5-10 mm). To maintain the equivalent channel resistance, compensation in channel size might be needed as the angled channels will be longer than the perpendicular channels. Therefore, the non-perpendicular channels should have a greater diameter than the perpendicular channels, in some embodiments. The angle of incline for both central and peripheral non-perpendicular channels typically ranges from about 30 to about 75 degrees.

The flow-shaping elements suitable for embodiments presented herein, may have a flat or curved surface. In some embodiments the surface closest to the substrate is parallel to the plating face of the substrate. In other embodiments the surface facing the substrate is convex (i.e. the distance from that surface to the plating face of the substrate is smaller at the center than at the edge). FIG. 4C is a schematic cross-sectional view of such convex flow-shaping element 411 having a region of non-perpendicular channels 413 in the central portion of the flow-shaping element surrounded by a region 415 with perpendicular channels. In this illustration both the substrate-facing surface and the opposite surface of the flow-shaping element are convex, and the flow-shaping element has a generally uniform thickness.

It is noted that in the embodiments illustrated in FIGS. 4A-4E the regions of non-perpendicular channels (403, 407, 409 and 413) do not contain any perpendicular channels. In other words, perpendicular and non-perpendicular channels are segregated based on location. Such segregation does not need to be complete in all embodiments, but preferably the region of non-perpendicular channels should contain at least 80% of non-perpendicular channels, and the region of perpendicular channels should contain at least about 80% of perpendicular channels.

Figure 5A:
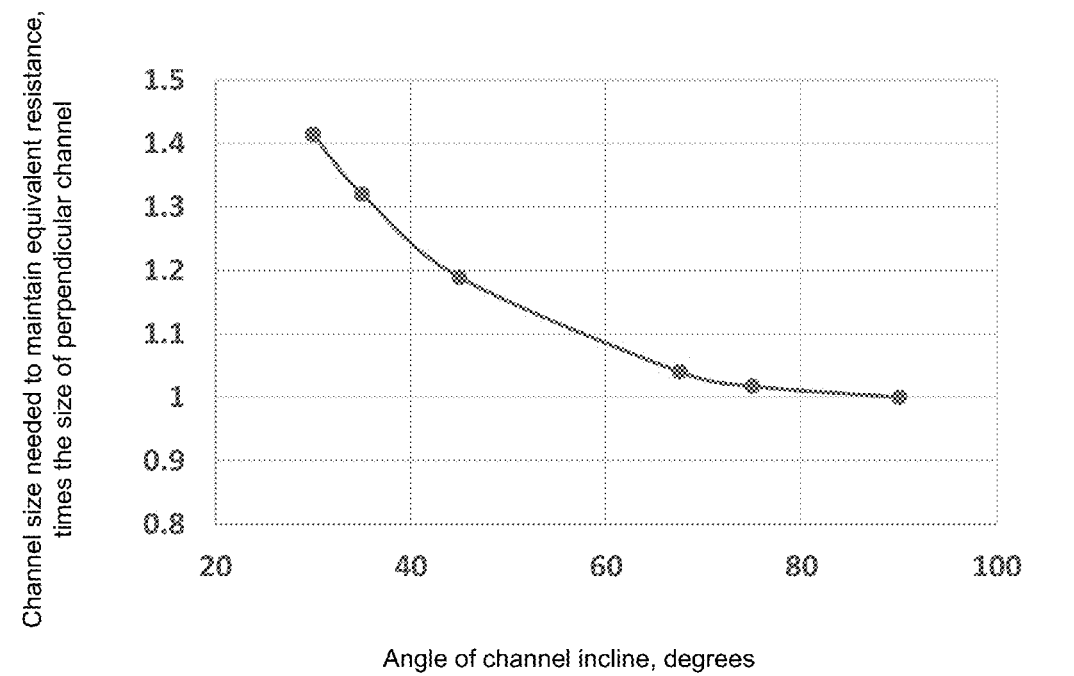
FIG. 5A is a plot illustrating channel sizes required to obtain an equivalent resistance for channels of different angles of incline, when channels are filled with electrolyte.

The size of the channels (referring to the channel width or diameter) is typically less than about 1 cm, more preferably less than about 5 mm. In some embodiments, the sizes of the channels are selected such as to obtain substantially equal equivalent resistance from each channel. For example, because the non-perpendicular channels are longer than perpendicular channels, non-perpendicular channels would have greater resistance than perpendicular channels if they had the same size, when they are filled with the same electrolyte. Therefore, to compensate for this effect, in some embodiments the non-perpendicular channels have greater size than perpendicular channels. In some embodiments the size correction is optimized such as to obtain substantially equal resistances from all channels of the flow-shaping element. FIG. 5A provides a plot illustrating channel size as a function of the angle of channel incline for channels maintaining equivalent resistances. It can be seen that as the angles get smaller, the channel size should get bigger in order to maintain equivalent resistance. For example, a channel having an angle of incline of 45 degrees, should have a diameter that is about 1.2 times greater than a diameter of a perpendicular channel in order to obtain equivalent resistance, and a channel having an angle of incline of about 30 degrees, should have a diameter that is about 1.4 times greater than a diameter of a perpendicular channel in order to obtain equivalent resistance.

Figure 5B:
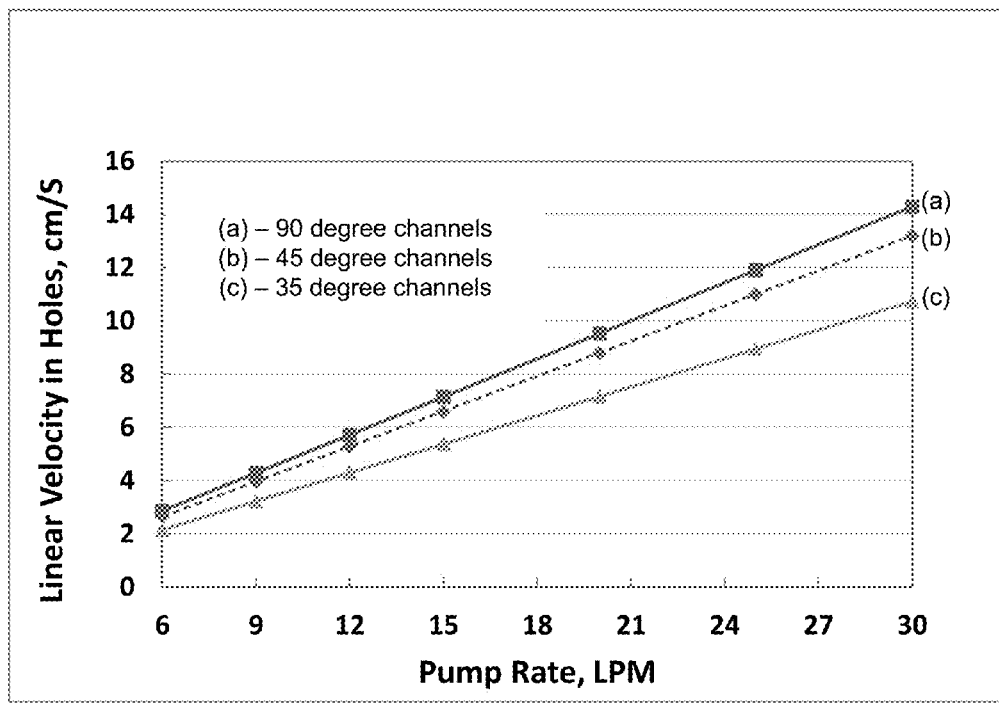
FIG. 5B is a plot illustrating linear velocity of electrolyte in the channels as a function of electrolyte pump rate for channels having different angles of incline.

One of the benefits of the use of non-perpendicular channels in the flow-shaping element is the reduction in linear velocity of electrolyte, in comparison with the perpendicular channels, for the same rate of electrolyte delivery (pump rate). This reduction in linear velocity is needed in the center of the wafer substrate to alleviate the jetting effect and to remove the uniformity defect which manifests itself as concentric rings in the central portion of the wafer. FIG. 5B illustrates the dependence of linear velocity of electrolyte in the channels as a function of electrolyte pump rate for channels having a 90 degree angle (curve a), a 45 degree angle (curve b) and a 35 degree angle (curve c). It can be seen that a significant reduction in the linear velocity of electrolyte is obtained for non-perpendicular channels. It should be noted that the reduction in linear velocity, while usually beneficial at the central region, can be detrimental at the edge and mid-radius regions of the wafer as it results in decreased impinging flow. This is one of the reasons why non-perpendicular channels should be used locally, rather than globally throughout the entirety of the flow-shaping element. Local use of the non-perpendicular channels also offers additional advantage when used in a concave or convex flow-shaping element. If these non-planar elements were globally equipped with non-perpendicular channels (i.e. when 100% of the channels are non-perpendicular), the length of these channels would vary across the flow-shaping element (which is not the case for planar flow-shaping elements). This variation in lengths leads to variations in resistivity, which is extremely difficult to correct on a global scale. This problem is addressed, when the non-perpendicular channels are provided only locally (e.g., just close to the center of the flow-shaping element), where the variation in length is minimal.

Figure 6A:
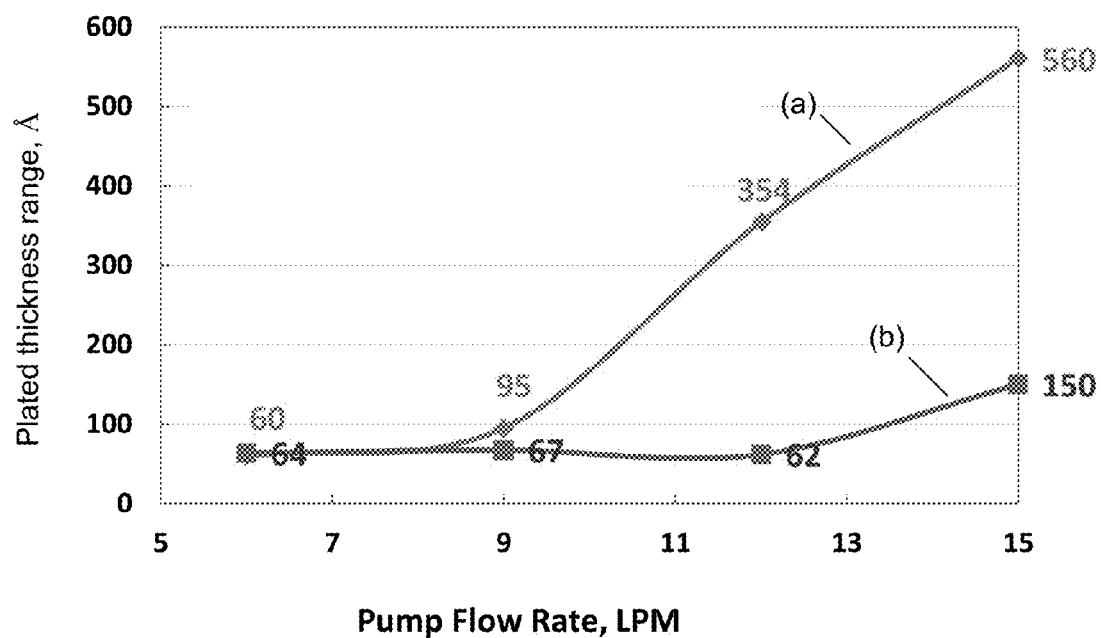
FIG. 6A is an experimental plot illustrating electroplated thickness range as a function of electrolyte delivery rate for electroplating with a flow-shaping element having 100% perpendicular channels (curve (a)) and for electroplating with a flow-shaping element having non-perpendicular channels in the central region, surrounded by perpendicular channels (curve (b)).

The improvement of plating uniformity with the use of a flow-shaping element having groups of perpendicular and non-perpendicular channels was experimentally validated. FIG. 6A is a plot illustrating central thickness range for 7,000 Å of electrodeposited copper as a function of electrolyte flow rate. Curve (a) illustrates results for electroplating with a conventional flow-shaping element having only perpendicular channels. Curve (b) illustrates results for electroplating in an apparatus equipped with a flow-shaping element having 75 channels angled at 45 degrees in the central portion of the substrate surrounded by perpendicular channels, where the total number of channels was about 9000. The electroplating conditions were otherwise identical (plating current of 15 A and substrate rotation rate of 120 rpm). It can be seen that the central thickness range is significantly reduced with the use of a flow-shaping element having a central region of non-perpendicular channels.

Figure 6B:
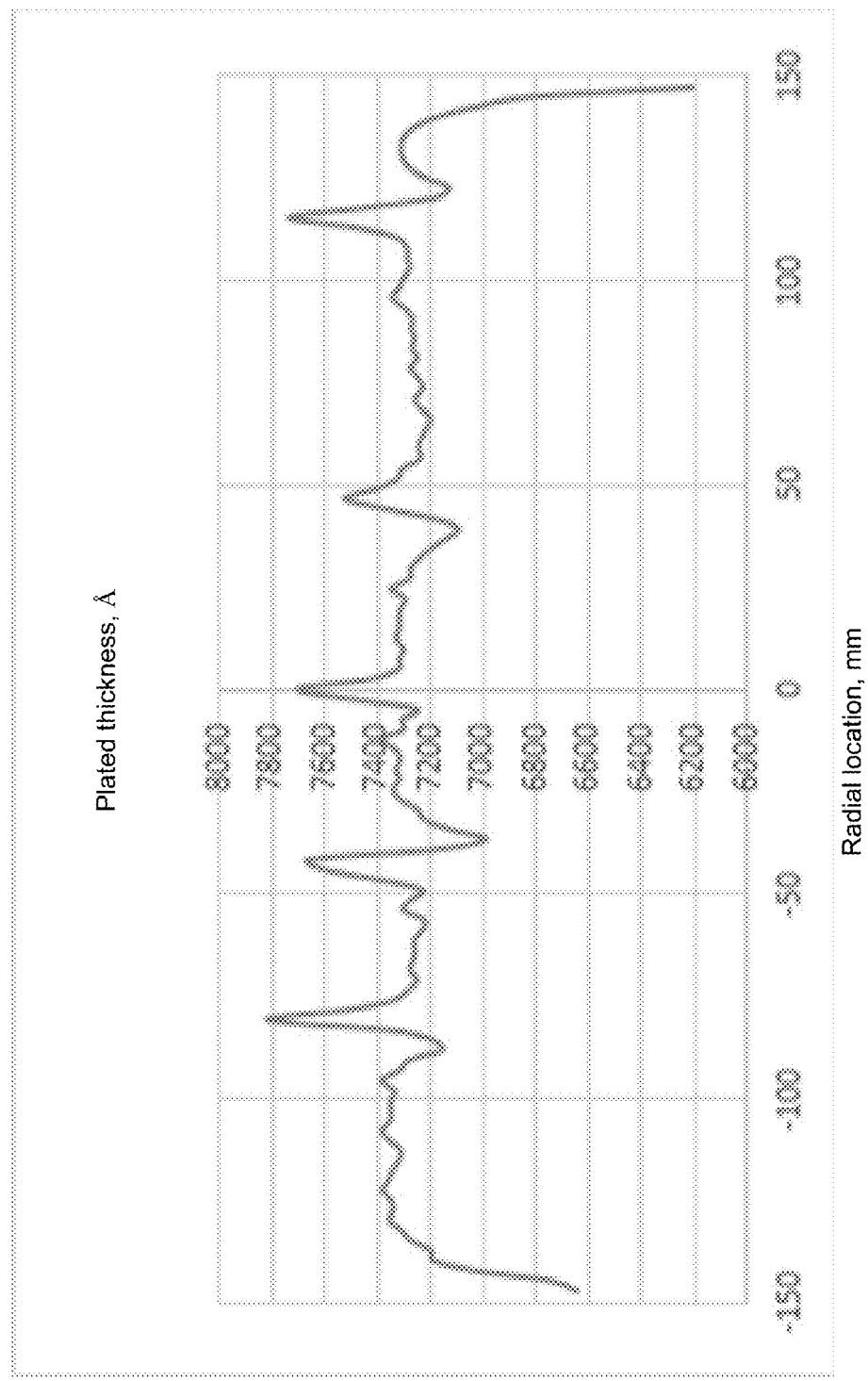
FIG. 6B is an experimental radial profile of electroplated thickness for electroplating with a flow-shaping element having 100% non-perpendicular channels (comparative example).
Figure 6C:
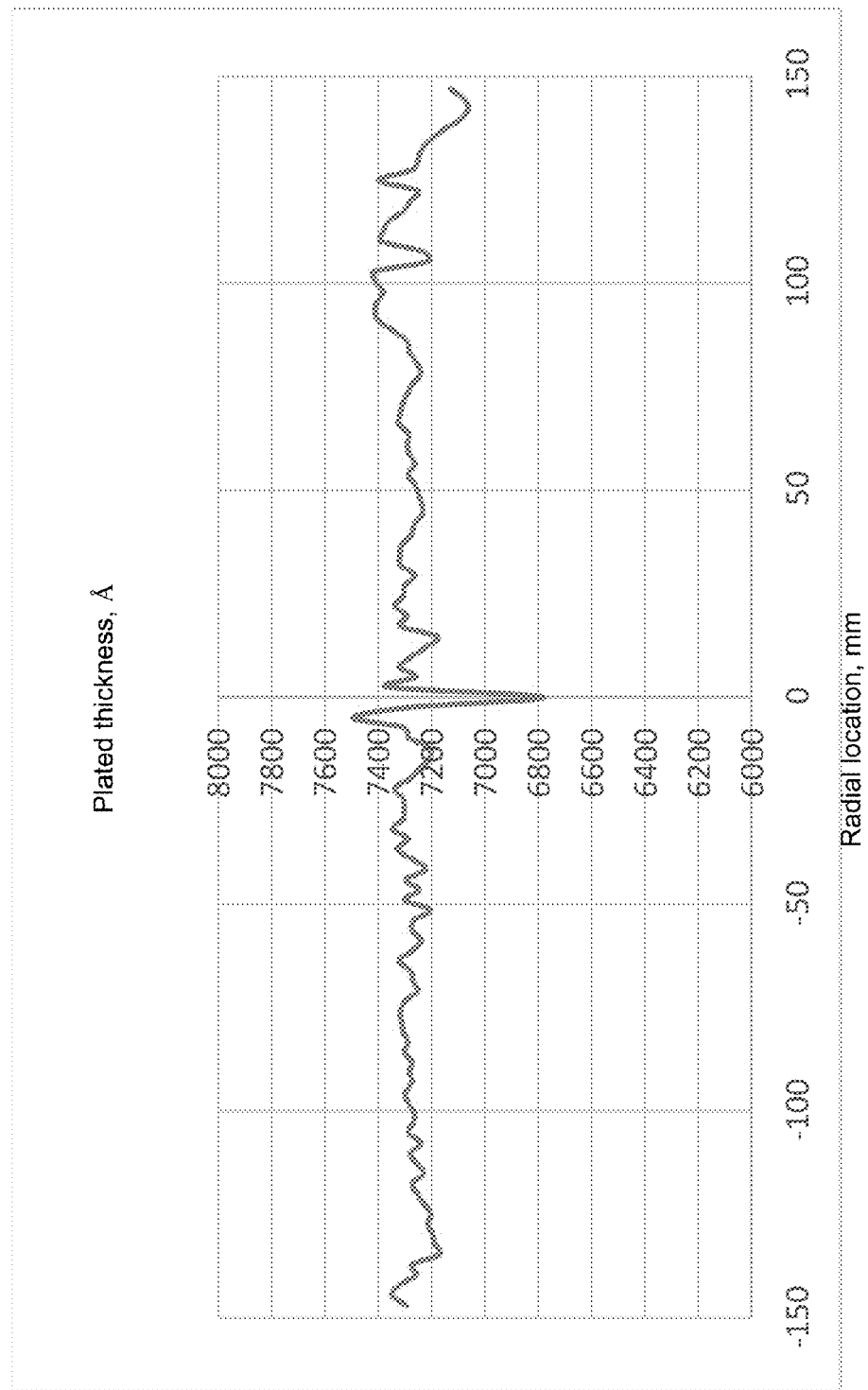
FIG. 6C is an experimental radial profile of electroplated thickness for electroplating with a flow-shaping element having non-perpendicular channels in the center surrounded by perpendicular channels.

Further, a flow-shaping element having spatially segregated groups of perpendicular and non-perpendicular channels can offer, in some embodiments, a number of advantages over a flow-shaping element in which 100% of channels are non-perpendicular channels. It was observed that the use of flow-shaping plates having 100% of non-perpendicular channels can improve uniformity in some cases, but can still provide unacceptable uniformity of plating under certain conditions (e.g., at high plating currents and high electrolyte delivery rates), which may manifests in central spikes and halos on the wafer substrate. These can be alleviated by using flow-shaping plates having non-perpendicular channels only in the central portion of the flow-shaping element that are surrounded by perpendicular channels. This is illustrated by the experimental plots provided in FIGS. 6B and 6C. FIG. 6B shows radial thickness profile for electroplating copper at 25 Amp plating current with an electrolyte delivery rate of 30 liters per minute and wafer rotation rate of 300 rpm using a flow-shaping element having 100% of non-perpendicular channels. It can be seen that substantial spikes in plated thickness are observed. FIG. 6C is a radial thickness profile for electroplating under the same conditions as in FIG. 6B, but using a flow-shaping element having 50 central channels angled at 45 degrees (25 angled in one direction, and 25 angled in a different direction), wherein the rest of the channels on the plate are perpendicular channels. A substantial improvement of plated uniformity is observed. In addition, it should be noted that a flow-shaping element with 100% non-perpendicular channels can be more expensive to manufacture than an element having only a small fraction of non-perpendicular channels.

Further, a plate having 100% non-perpendicular channels, would contain a region at the edge where the channels are cut-off, since the number of channels on the plate will be reduced due to angling. Due to the cut-off problem, a substantial variation in thickness may arise at the near edge region. Finally, as it was previously mentioned, if the flow-shaping plate is convex or concave, it is easier to maintain equivalent resistivity of all channels, when only a small fraction of them are non-perpendicular, since the non-perpendicular channels will have varying length in such plate.

The flow-shaping element having groups of perpendicular and non-perpendicular channels can be used in a variety of electroplating apparatuses. One example of a suitable electroplating system that can employ such a plate us a SABRE electroplating apparatus, available from Lam Research Corp., Fremont Calif. The electroplating apparatus typically contains an electroplating chamber configured to hold an anode (e.g., an inert or active anode) and an electrolyte (e.g., a solution containing metal salt, acid, and electroplating additives, such as accelerators, suppressors, and levelers). The electroplating apparatus further includes a substrate holder configured to hold and rotate the substrate during electroplating. The power supply of the electroplating apparatus is electrically connected to the substrate and to the anode, and is configured to electrically negatively bias the substrate. A plurality of electrical contacts typically contact the substrate at the edge and are connected to the power supply. The apparatus further includes a fluidic conduit and a pump to introduce the electrolyte into the plating chamber.

Figure 7A:
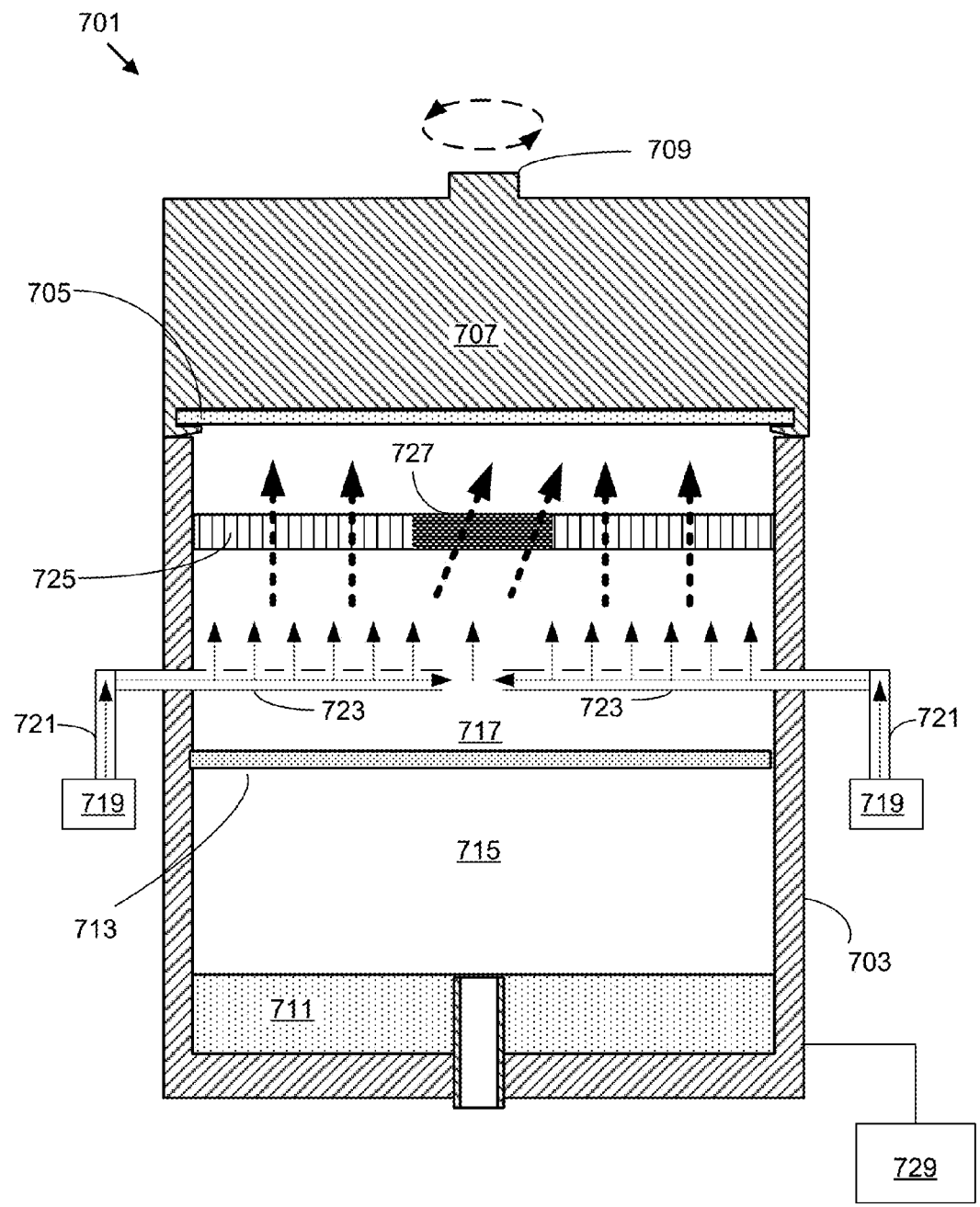
FIGS. 7A-7C are schematic cross-sectional views of different electroplating apparatuses in accordance with embodiments provided herein.

A diagrammatical cross-sectional view of an example of a suitable electroplating apparatus 701 is shown in FIG. 7A. The plating chamber 703 contains the electrolyte, which typically includes a source of metal ions (e.g., a copper salt) and an acid. A wafer 705 is immersed into the plating solution and is held by a "clamshell" holding fixture 707, mounted on a rotatable spindle 709, which allows rotation of clamshell 707 together with the wafer 705. A general description of a clamshell-type plating apparatus having aspects suitable for use with this invention is described in detail in U.S. Pat. No. 6,156,167 issued to Patton et al., and U.S. Pat. No. 6,800,187 issued to Reid et al, which are herein incorporated by reference in their entireties. An anode 711 (which may be an inert or a consumable anode) is disposed below the wafer within the plating chamber 703 and is separated from the wafer region by a membrane 713, preferably an ion selective membrane. The region 715 below the anodic membrane is often referred to as an "anode chamber" or "anolyte compartment" and electrolyte within this chamber as "anolyte". The region 717 above the membrane 713 is referred to as a "catholyte compartment". The ion-selective anode membrane 713 allows ionic communication between the anodic and cathodic regions of the plating cell, while preventing the particles generated at the anode from entering the proximity of the wafer and contaminating it and/or undesirable chemical species, present in the catholyte electrolyte, from coming into contact with the anode 711.

The electrolyte is continuously provided to the plating chamber 703 by a pump (not shown) from the source of electrolyte 719 upwards through a fluidic conduit 721, and then through a plurality of tubes 723, which are configured to distribute the electrolyte within the plating chamber. The tubes have a generally open cylindrical shape, where the cylinder has a plurality of openings in its wall. These tubes are also referred to as flutes. The electrolyte flows from the openings in the tubes upwards as shown by arrows towards the flow-shaping element 725. In other implementations, the electrolyte may flow from the openings in the tubes horizontally, or even downwards towards the membrane. In the embodiment illustrated by FIG. 7A, the openings in the tubes 723 are distributed uniformly, which results in uniform distribution of electrolyte to the central and peripheral portions of the plating chamber, and, consequently to central and peripheral portions of the flow-shaping element 725. The flow-shaping element 723 in the depicted embodiment has non-perpendicular channels 727 in the central portion of the flow-shaping element, while the remaining area of the flow-shaping element contains perpendicular channels. The flow of electrolyte through the flow-shaping element is schematically shown by arrows. After the electrolyte flows through the flow-shaping element, excess electrolyte exits the plating chamber by overflowing the side wall of the plating chamber. In other embodiments, there may be a different outlet for excess electrolyte outflow. Further the anolyte compartment 715 has its own inlet, outlet and recirculation loop for recirculation of anolyte (not shown).

A direct current (DC) power supply (not shown) can be used to control current flow to the wafer 705, and the anode 711. The power supply is configured to negatively bias the wafer 705 and positively bias the anode 711 and can control the plating current by providing a required power to the plating cell (e.g., by providing the required current and/or voltage to the wafer and the anode). The apparatus further includes a controller 729, which allows modulation of current and/or potential provided to the elements of the electroplating cell. The controller may include program instructions and/or built in logic specifying power levels (including current and voltage levels) that need to be applied to various elements of the plating cell, as well as times at which these levels need to be changed. For example, it may include program instructions for supplying power to the electroplating apparatus in accordance with a pre-determined waveform. The controller may further include program instructions and/or built in logic to regulate electrolyte pump rates and rotation rates for the substrate, in accordance with the methods provided herein.

Figure 7B:
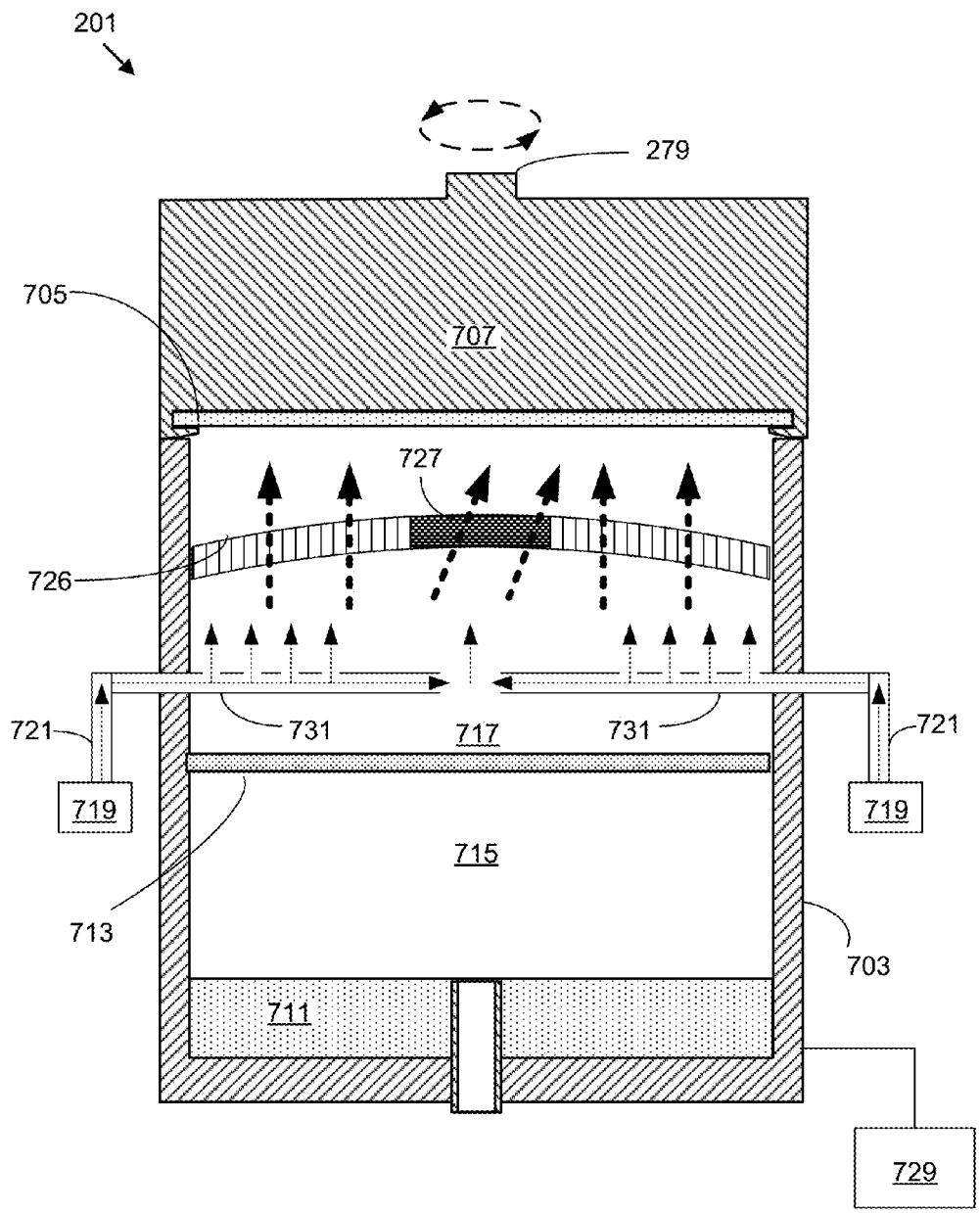

FIG. 7B illustrates another embodiment of an electroplating apparatus. In this embodiment, the flow-shaping element 726 is convex. The apparatus with such convex flow-shaping element can experience a deficit of electrolyte flow at the peripheral portion of the plating chamber. To compensate for this imbalance in flow, in this embodiment the tubes 731 that are delivering electrolyte to the electroplating chamber are designed such as to provide more electrolyte flow to the peripheral portion of the electroplating chamber than to the central portion of the electroplating chamber. The openings in the walls of the tubes are distributed unevenly in this embodiment, with a higher frequency of holes at the peripheral part of the tube than at the central part of the tube.

Figure 7C:
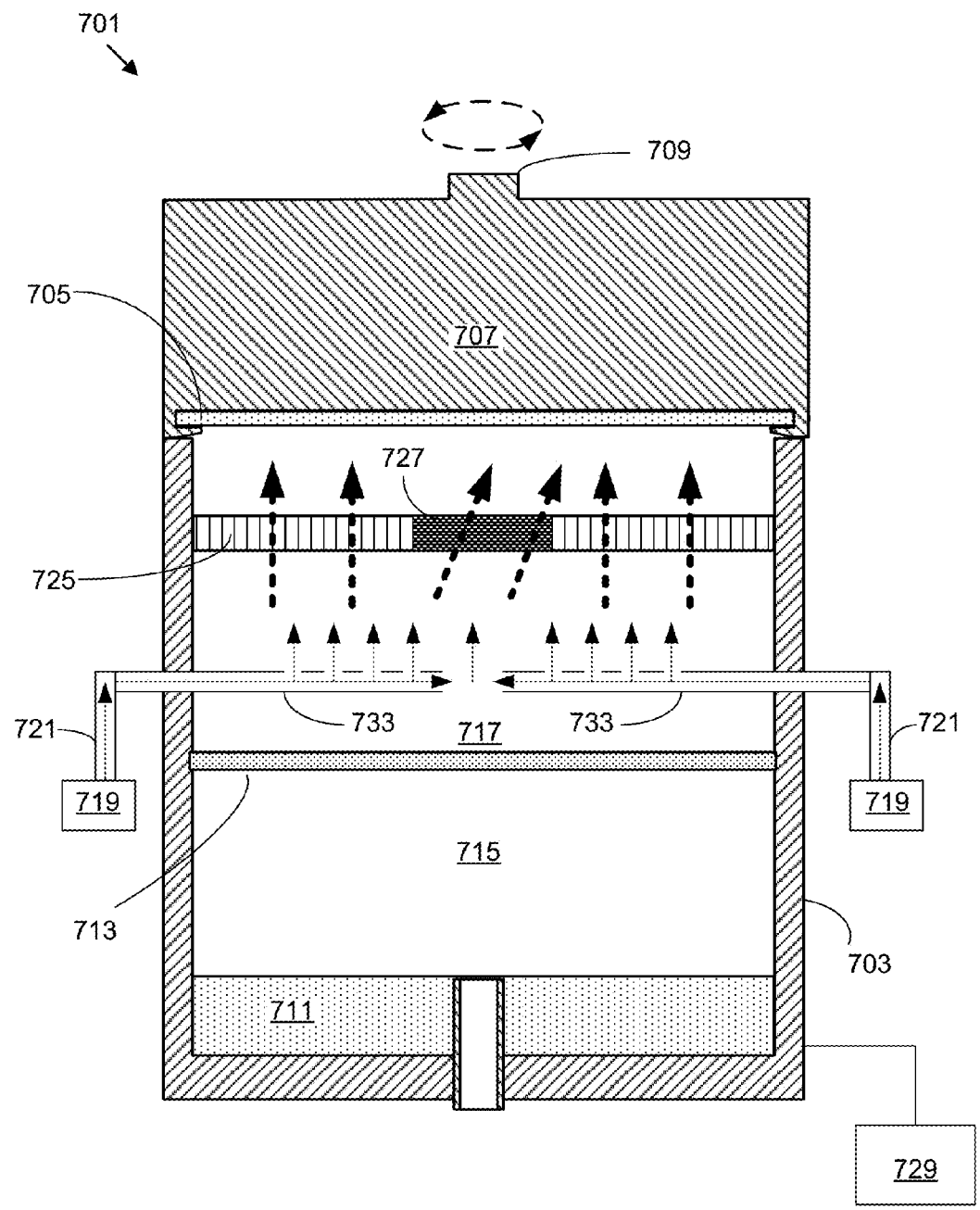

FIG. 7C illustrates an embodiment of an electroplating apparatus, in which the tubes 733 are configured to flow more electrolyte to the central portion of the plating chamber than to its peripheral portion. The openings in the wall of these tubes are distributed unevenly, with higher frequency of openings in the central portion of the tube than in the peripheral portion of the tube. These tubes are used in combination with a flat flow-shaping element, and compensate for the deficit of flow at the central portion of the plating chamber.

Figure 8:
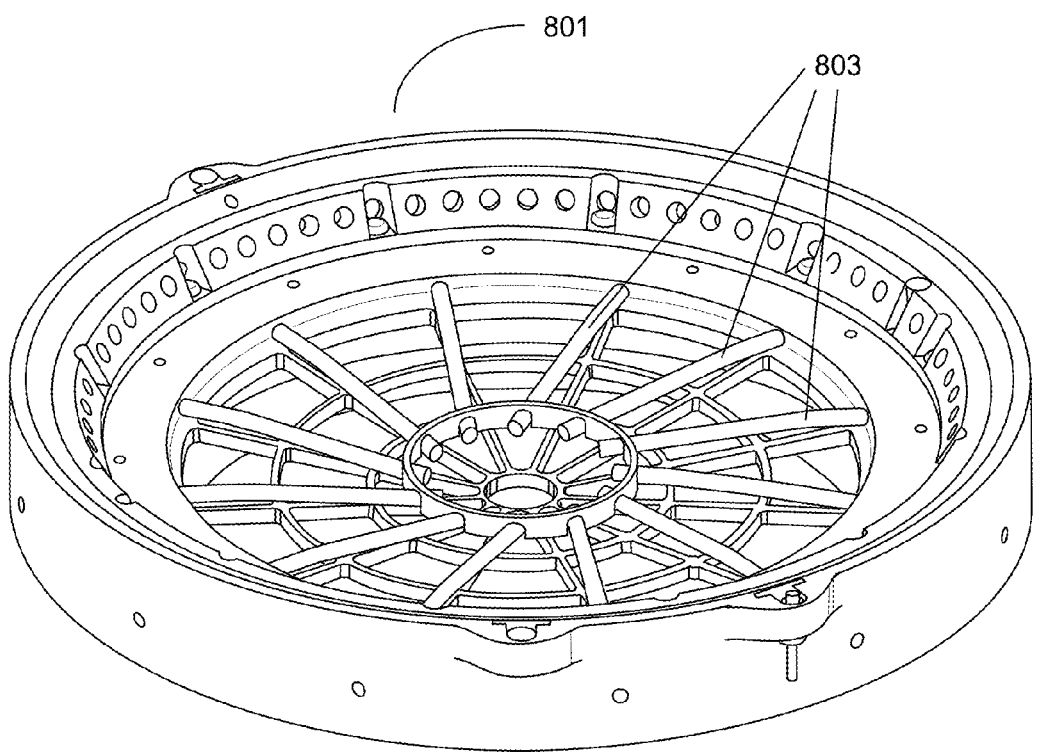
FIG. 8 is an isometric view of a portion of an electroplating apparatus having a plurality of tubes configured for distributing flow of electrolyte in the electroplating chamber in accordance with an embodiment provided herein.

FIG. 8 shows an isometric view of a part of the electroplating apparatus 801, which contains twelve tubes 803 that are configured for delivery and distribution of electrolyte in the electroplating chamber. The openings in the walls of tubes are not shown in this view. The tubes are directed radially from a circular wall of this part towards the center of the electroplating chamber. Each tube has an opening at the end which opens into the central portion of the electroplating chamber. The part 801 is positioned below the flow-shaping element and above the membrane that separates anolyte and catholyte, referring to embodiments shown in FIGS. 7A-7C.

Figure 9:
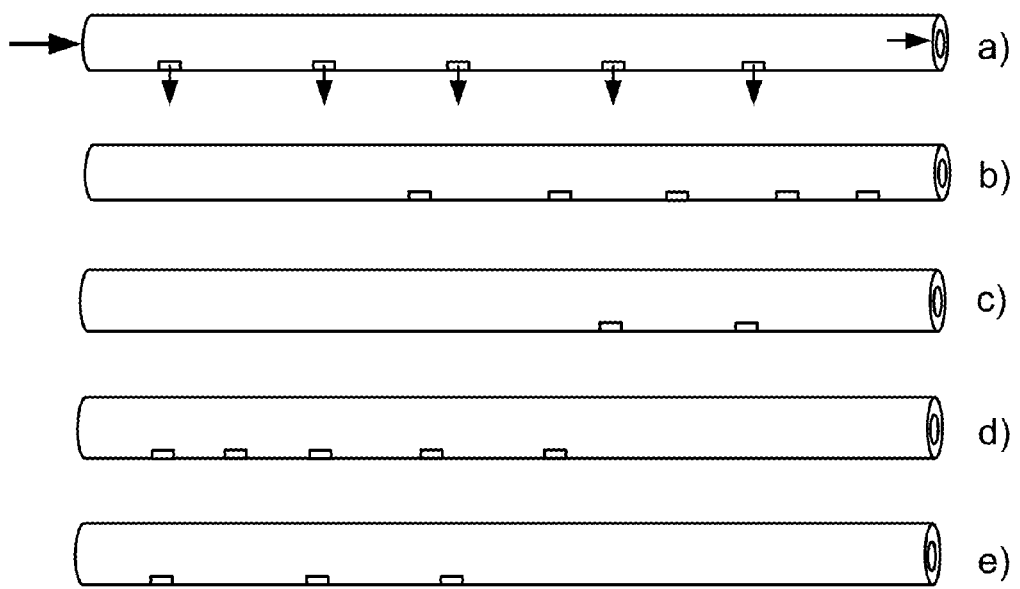
FIG. 9 illustrates side views of several different types of tubes in accordance with embodiments provided herein.

FIG. 9 illustrates side views of different types of tubes that can be used for electrolyte delivery. The flow of electrolyte through the tube and out of the tube openings is shown by arrows for tube (a) and is not shown for other tubes to preserve clarity. The peripheral portion of the tube is on the left side and the central portion of the tube is on the right side, wherein the peripheral and central portions refer to the position within the plating chamber. These views show different distributions of openings in the walls of the tubes that can be used to regulate the direction of electrolyte flow. For example, tube of type (a) has a uniform distribution of openings in its wall. Tubes (b) and (c) have more openings at the central portion of the tube than at the peripheral portion. Tubes (d) and (e), are configured for preferential delivery of electrolyte towards the peripheral portion of the plating chamber, and have more openings at the peripheral portions of the tube than at the central portions.

Figure 10:
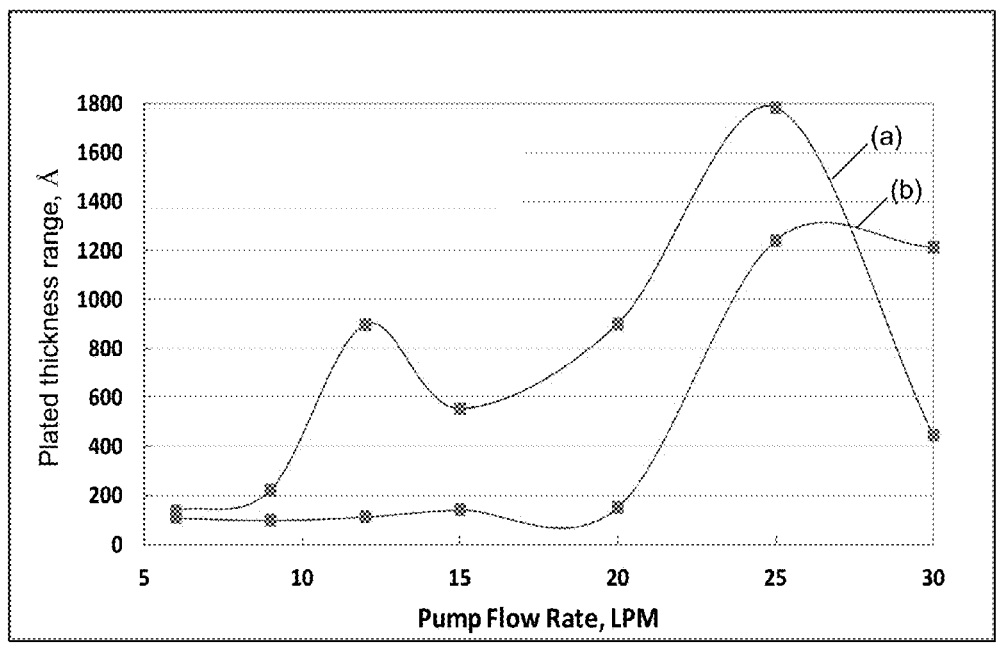
FIG. 10 illustrates experimental plot showing an improvement in non-uniformity with the use of tubes configured to preferentially direct electrolyte flow towards the central portion of the plating chamber.

FIG. 10 illustrates the advantages of using tubes optimized for preferential electrolyte delivery to a desired location in the plating chamber. FIG. 10 is a plot illustrating the dependence of electroplated thickness range in Ångstroms on the pump rate of electrolyte in liters per minute for an electroplating apparatus having electrolyte delivery tubes configured for uniform delivery of electrolyte (curve (a)) and for an electroplating apparatus having electrolyte delivery tubes configured for preferential delivery of electrolyte towards the central portion of the electroplating chamber (curve (b)). Other electroplating parameters were identical in both cases and in both cases the apparatus included a flow-shaping element having a rectangular region in the central portion with 5×15 (75) non-perpendicular channels having an incline angle of 45 degrees, whereas the remaining channels were perpendicular. It can be seen that the use of tubes that preferentially direct electrolyte to the central portion of the plating chamber results in reduction of thickness range for all pump rates at or below 25 liters per minute.

Figure 11:
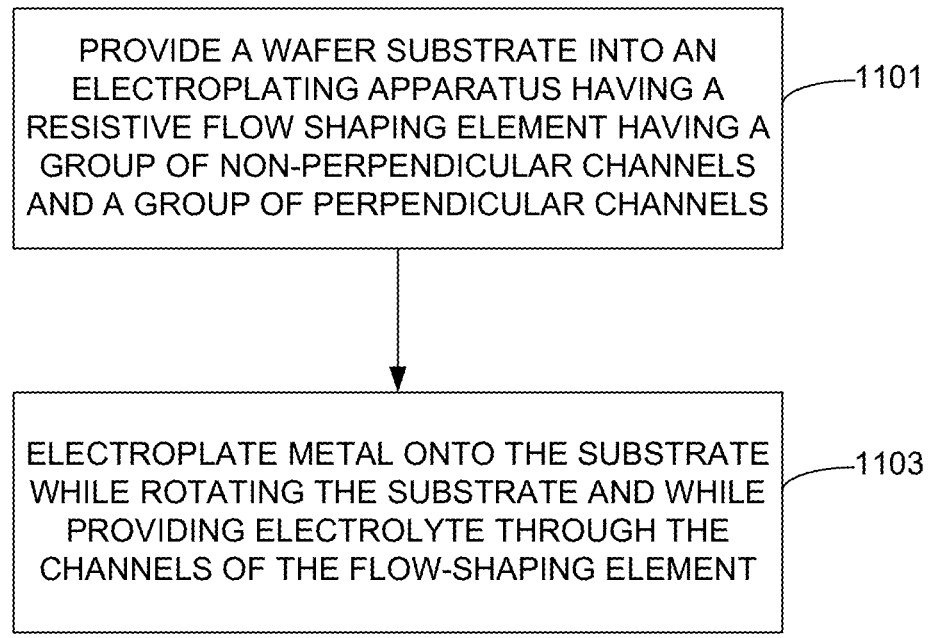
FIG. 11 is a process flow diagram for an electroplating method in accordance with an embodiment provided herein.

Methods for electroplating a layer of metal on a semiconductor substrate having one or more recessed features are also provided. The methods are illustrated by the process flow diagram shown in FIG. 11. The process starts in 1101 by providing the substrate into an electroplating apparatus having a resistive flow-shaping element having a group of non-perpendicular channels and a group of perpendicular channels. The perpendicular and non-perpendicular channels are substantially spatially segregated. The apparatus can be in accordance with any of the embodiments described above. For example, the apparatus may include a flow-shaping element having a group of non-perpendicular channels (e.g., channels with an incline angle of between about 35-70 degrees) in the central portion of the flow-shaping element surrounded by the perpendicular channels. Next, in 1103 the metal is electroplated while rotating the substrate and while providing the electrolyte through the channels of the flow-shaping element. During electroplating the plating face of the substrate is brought in contact with the electrolyte and the substrate rotates, typically at a rotation rate of between about 10-300 rpm. The electrolyte is provided to the electroplating chamber during the course of electroplating, e.g., at a pump rate of between about 3-40 lpm. The provided electrolyte passes through the channels of the flow-shaping element and flows towards the rotating substrate. In some embodiments, 100% of the provided electrolyte flows through the channels of the flow-shaping element (i.e., there are no additional conduits that bypass the flow-shaping element and provide the electrolyte directly to the wafer surface). The substrate is negatively biased during electroplating by a power supply, while an anode is positively biased.

In some embodiments, it is preferable to use several steps with different levels of power provided by the power supply, different substrate rotation rates and different electrolyte delivery rates, in order to further improve uniformity of electroplating. In one embodiment, the electroplating method uses an electroplating waveform that has at least three steps: a first low power step, which is followed by a second "pause" step, which is then followed by a third high power step. The power provided in the electroplating apparatus in the first step is lower than the power provided to the apparatus in the third step, and the power provided to the apparatus during the second "pause" step is close to zero. It was also determined that it is advantageous for uniformity to spin the wafer at a very high rate of at least about 200 rpm during the "pause" step.

Figure 12A:
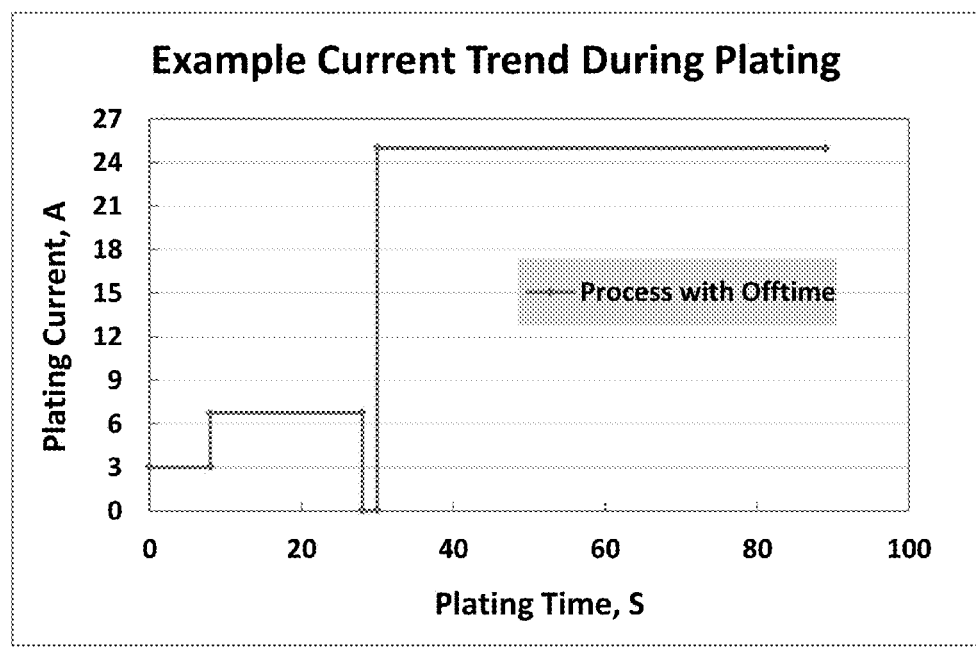
FIG. 12A is a plot illustrating an example of an electroplating current modulation in accordance with an embodiment presented herein.

Power can be varied by varying the current and/or voltage provided by the power supply to the apparatus. For example, the first step (low power low current step) may be conducted by providing current and/or voltage corresponding to 6 Amperes of plating current, then in the second step the plating current is decreased to zero and is maintained at zero for a short period of time, followed by an increase to 25 Amperes, where 25 Amperes are maintained during the third electroplating period. This waveform is illustrated in FIG. 12A, which illustrates the dependence of the plating current (regulated by the power supply) on the plating time. The process includes a low current step that has two sub-steps (plating at 3 Amp and at 6 Amp), followed by a pause step (pause at 0 Amp), and a high current plating step (plating at 25 Amp).

Figure 12B:
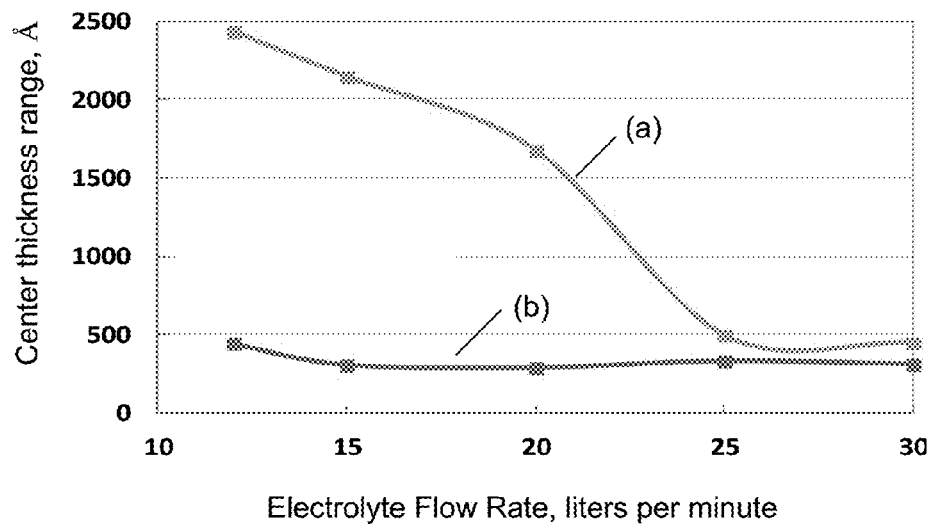
FIG. 12B is a plot illustrating the dependence of electroplated thickness range in the center of the wafer substrate on the rate of electrolyte delivery for a process without a pause in plating current (curve (a)), and for a process with a pause in plating current (curve (b)).

The improvement in plating uniformity that was obtained by this process is illustrated in FIG. 12B, where a plot illustrating center thickness range as a function of electrolyte delivery rate is shown for a process with a 2 second pause step (curve (b)), which follows the plot provided in FIG. 12A, and a process without a 2 second pause step (having only low current and high current steps), curve (a). The thickness range is significantly reduced by using the pause step.

Further it was found that modulation of electrolyte delivery rate (pump rate) during the electroplating process in coordination with changes to the amount of power provided to the system, can lead to further improvement in plating uniformity. In a conventional electroplating method, the electrolyte delivery rate is typically kept constant. In one of the embodiments provided herein the electrolyte delivery rate is low during most or all of the first low power step, and is high during most or all of the third high power step. For example, in one embodiment illustrated by FIG. 12C, the flow rate is kept at 6 liters per minute during the 3 Amp and 6 Amp low power step (Step 1), and is kept at about 25 liters per minute during the 25 Amp high power step (Step 3). This embodiment is illustrated by curve (b), and the conventional constant delivery rate method is illustrated by line (a). Generally the increase in electrolyte delivery rate can occur during the later part of low power step, during the pause step, and/or during the beginning of the high power step.

Figure 12C:
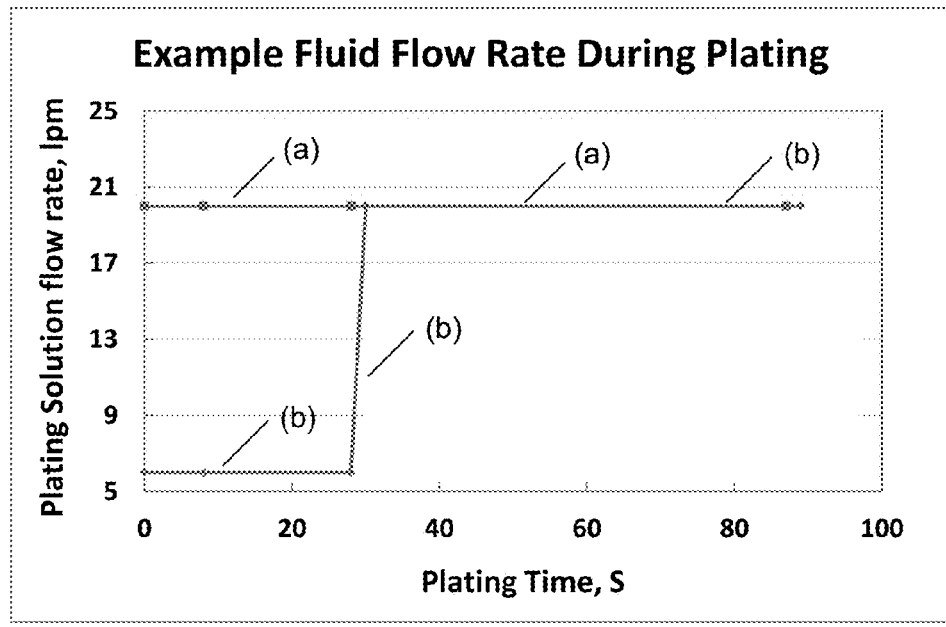
FIG. 12C is a plot illustrating electrolyte flow to the electroplating apparatus in a conventional delivery of electrolyte (curve (a)) and in accordance with one of the embodiments provided herein (curve (b))
Figure 12D:
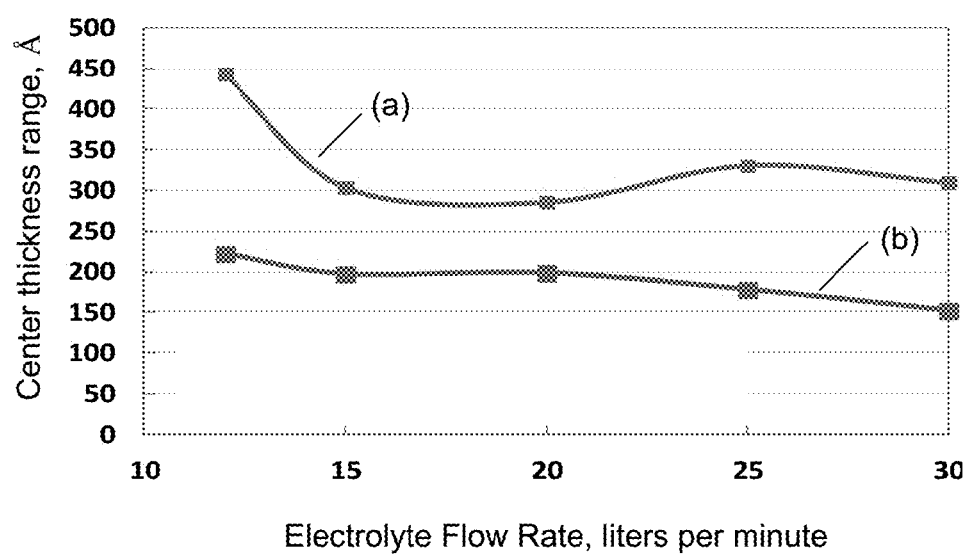

FIG. 12D is a plot showing dependence of center thickness range on the electrolyte delivery rate in the third high power step, for a process in which the electrolyte delivery rate was kept constant during the first, second and third steps (curve (a)) and for the process in which the electrolyte delivery rate was 6 liters per minute in the first lower power step, and was then increased to the target flow rate for the third high power step (curve (b)). It can be seen that improvement in non-uniformity is observed for all electrolyte delivery rates in this case.

In all examples illustrated in FIGS. 12A-12C, an electroplating apparatus having a flow-shaping element with a rectangular region of 5×15 (75) non-perpendicular channels located in the central portion of the flow-shaping element was used. The channels were inclined at 45 degrees and this rectangular region was surrounded by perpendicular channels, such that the perpendicular and non-perpendicular channels were 100% spatially segregated (i.e., there were no perpendicular channels within the area defined by the rectangle of non-perpendicular channels). In these examples, the electrolyte-delivering flutes provided uniformly distributed flow of electrolyte, as shown in the apparatus of FIG. 7A. The electroplating conditions in the experimental examples used in comparison were identical, unless noted.

Figure 13:
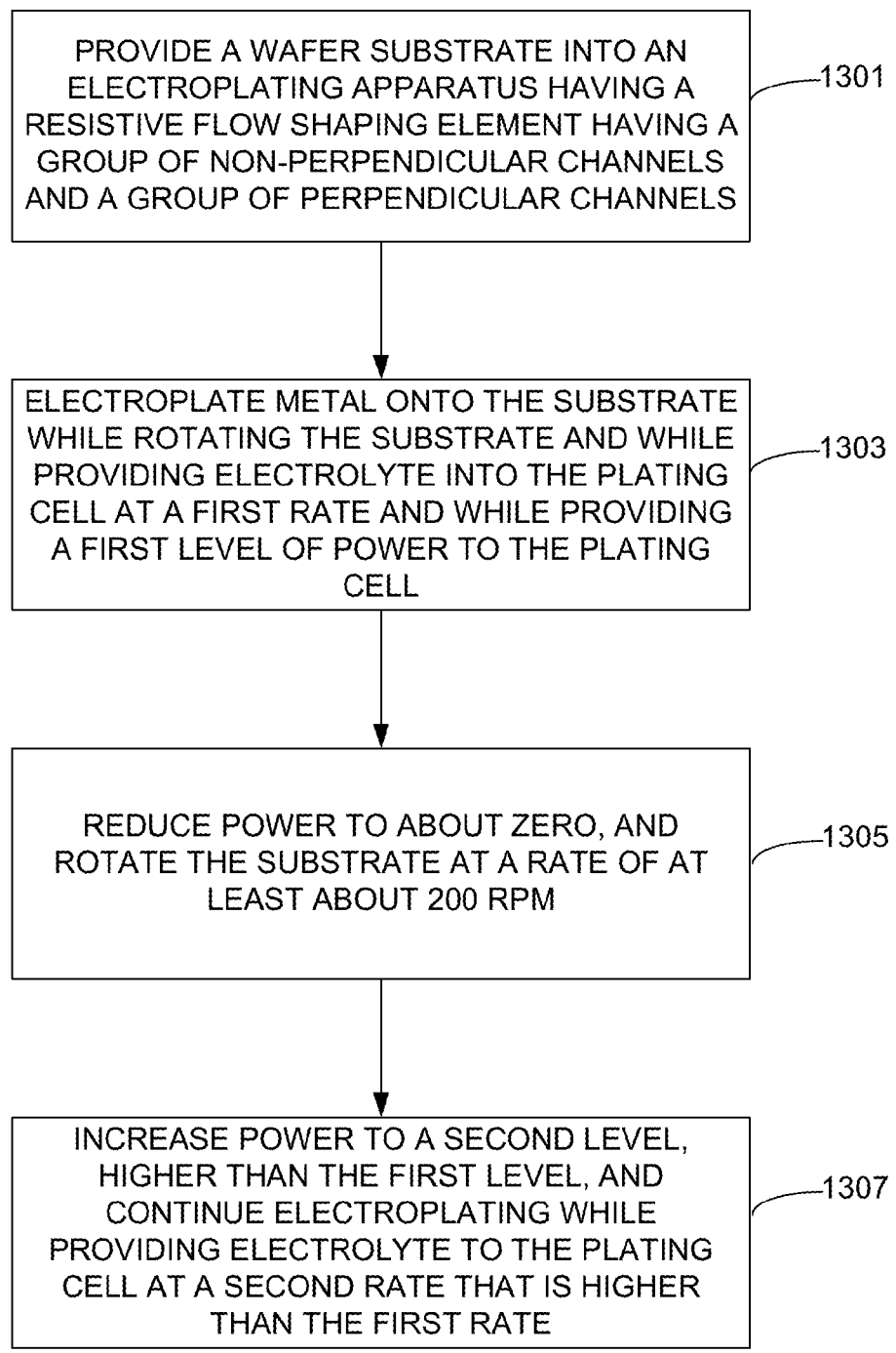
FIG. 13 is a process flow diagram for an electroplating method in accordance with an embodiment provided herein.

The improvement in plating uniformity due to changes in electrolyte flow rate is separate from the improvement due to the introduction of the "pause" step between the low power and high power steps. These two approaches (change in electrolyte delivery rate, and introduction of a "pause" step) can be used separately or in combination. An electroplating method that uses a combination of these approaches is illustrated in the process flow diagram presented in FIG. 13. The process starts in 1301 by providing a wafer substrate into an electroplating apparatus having a flow-shaping element having a group of non-perpendicular channels and a group of perpendicular channels. The two groups are substantially spatially segregated. In operation 1303 the metal is electroplated while the substrate is rotated and while electrolyte is provided into the electroplating chamber at a first rate, and while power is provided to the electroplating apparatus at a first level (corresponding to a first level of plating current). This operation corresponds to the first, low power step discussed above. Next, in 1305, power is reduced to about zero (corresponding to a plating current of about zero) and the substrate is rotated at a rate of at least 200 rpm. This step corresponds to the second "pause" step. Next, in operation 1307 the power is increased to a second level (corresponding to the second level of the plating current), which is greater than the first level of power (and correspondingly, the second level of plating current is greater than the first level of plating current), and electroplating continues while electrolyte is provided to the electroplating chamber at a second rate, which is higher than the first rate. This step corresponds to the third, high power step discussed above.

As it was previously mentioned, in some embodiments the electroplating apparatus provided herein includes a controller having program instructions and/or logic for performing any of the processes described herein. The controller will typically include one or more processors and one or more memory devices configured to execute the instructions so that the apparatus will perform the methods provided herein. A machine-readable media containing the instructions will typically be coupled with the controller.

In some implementations, a controller is part of a system, which may be part of the above-described examples. Such systems can comprise semiconductor processing equipment, including a processing tool or tools, chamber or chambers, a platform or platforms for processing, and/or specific processing components (a wafer pedestal, a gas flow system, etc.). These systems may be integrated with electronics for controlling their operation before, during, and after processing of a semiconductor wafer or substrate. The electronics may be referred to as the "controller," which may control various components or subparts of the system or systems. The controller, depending on the processing requirements and/or the type of system, may be programmed to control any of the processes disclosed herein, including the delivery of processing gases, temperature settings (e.g., heating and/or cooling), pressure settings, vacuum settings, power settings, radio frequency (RF) generator settings, RF matching circuit settings, frequency settings, flow rate settings, fluid delivery settings, positional and operation settings, wafer transfers into and out of a tool and other transfer tools and/or load locks connected to or interfaced with a specific system.

Broadly speaking, the controller may be defined as electronics having various integrated circuits, logic, memory, and/or software that receive instructions, issue instructions, control operation, enable cleaning operations, enable endpoint measurements, and the like. The integrated circuits may include chips in the form of firmware that store program instructions, digital signal processors (DSPs), chips defined as application specific integrated circuits (ASICs), and/or one or more microprocessors, or microcontrollers that execute program instructions (e.g., software). Program instructions may be instructions communicated to the controller in the form of various individual settings (or program files), defining operational parameters for carrying out a particular process on or for a semiconductor wafer or to a system. The operational parameters may, in some embodiments, be part of a recipe defined by process engineers to accomplish one or more processing steps during the fabrication of one or more layers, materials, metals, oxides, silicon, silicon dioxide, surfaces, circuits, and/or dies of a wafer.

The controller, in some implementations, may be a part of or coupled to a computer that is integrated with, coupled to the system, otherwise networked to the system, or a combination thereof. For example, the controller may be in the "cloud" or all or a part of a fab host computer system, which can allow for remote access of the wafer processing. The computer may enable remote access to the system to monitor current progress of fabrication operations, examine a history of past fabrication operations, examine trends or performance metrics from a plurality of fabrication operations, to change parameters of current processing, to set processing steps to follow a current processing, or to start a new process. In some examples, a remote computer (e.g. a server) can provide process recipes to a system over a network, which may include a local network or the Internet. The remote computer may include a user interface that enables entry or programming of parameters and/or settings, which are then communicated to the system from the remote computer. In some examples, the controller receives instructions in the form of data, which specify parameters for each of the processing steps to be performed during one or more operations. It should be understood that the parameters may be specific to the type of process to be performed and the type of tool that the controller is configured to interface with or control. Thus as described above, the controller may be distributed, such as by comprising one or more discrete controllers that are networked together and working towards a common purpose, such as the processes and controls described herein. An example of a distributed controller for such purposes would be one or more integrated circuits on a chamber in communication with one or more integrated circuits located remotely (such as at the platform level or as part of a remote computer) that combine to control a process on the chamber.

Without limitation, example systems may include a plasma etch chamber or module, a deposition chamber or module, a spin-rinse chamber or module, a metal plating chamber or module, a clean chamber or module, a bevel edge etch chamber or module, a physical vapor deposition (PVD) chamber or module, a chemical vapor deposition (CVD) chamber or module, an atomic layer deposition (ALD) chamber or module, an atomic layer etch (ALE) chamber or module, an ion implantation chamber or module, a track chamber or module, and any other semiconductor processing systems that may be associated or used in the fabrication and/or manufacturing of semiconductor wafers.

As noted above, depending on the process step or steps to be performed by the tool, the controller might communicate with one or more of other tool circuits or modules, other tool components, cluster tools, other tool interfaces, adjacent tools, neighboring tools, tools located throughout a factory, a main computer, another controller, or tools used in material transport that bring containers of wafers to and from tool locations and/or load ports in a semiconductor manufacturing factory.

The apparatus/process described hereinabove may be used in conjunction with lithographic patterning tools or processes, for example, for the fabrication or manufacture of semiconductor devices, displays, LEDs, photovoltaic panels and the like. Typically, though not necessarily, such tools/processes will be used or conducted together in a common fabrication facility. Lithographic patterning of a film typically comprises some or all of the following steps, each step enabled with a number of possible tools: (1) application of photoresist on a workpiece, i.e., substrate, using a spin-on or spray-on tool; (2) curing of photoresist using a hot plate or furnace or UV curing tool; (3) exposing the photoresist to visible or UV or x-ray light with a tool such as a wafer stepper; (4) developing the resist so as to selectively remove resist and thereby pattern it using a tool such as a wet bench; (5) transferring the resist pattern into an underlying film or workpiece by using a dry or plasma-assisted etching tool; and (6) removing the resist using a tool such as an RF or microwave plasma resist stripper.

What is claimed is:

1. An electroplating apparatus comprising:
   (a) a plating chamber configured to contain an electrolyte and an anode while electroplating metal onto a substantially planar substrate;
   (b) a substrate holder configured to hold the substantially planar substrate such that a plating face of the substrate is separated from the anode during electroplating;
   (c) a flow-shaping element comprising a substrate-facing surface and an opposing surface, the flow-shaping element comprising an ionically resistive material with a plurality of non-communicating channels made through the flow-shaping element, wherein said non-communicating channels allow for transport of the electrolyte through the flow-shaping element during electroplating from the opposing surface to the substrate-facing surface of the flow-shaping element, wherein the channels comprise a first plurality of channels that are not perpendicular to a plane defined by the plating face of the substrate and a second plurality of channels that are perpendicular to the plane defined by the plating face of the substrate, and wherein the first plurality of channels and the second plurality of channels are substantially spatially segregated.

2. The electroplating apparatus of claim 1, wherein the channels that are not perpendicular to the plane defined by the plating face of the substrate are directed at an angle of between about 30-75 degrees to the plane defined by the plating face of the substrate.

3. The electroplating apparatus of claim 1, wherein the first plurality of channels that are not perpendicular to the plane defined by the plating face of the substrate are located in a central portion of the flow-shaping element and are surrounded by the second plurality of channels that are perpendicular to the plane defined by the plating face of the substrate.

4. The electroplating apparatus of claim 1, wherein the first plurality of channels occupy a generally rectangular region in a central portion of the flow-shaping element.

5. The electroplating apparatus of claim 1, wherein the first plurality of channels occupy a generally circular region in a central portion of the flow-shaping element.

6. The electroplating apparatus of claim 1, wherein the flow-shaping element comprises between about 6,000-12,000 channels, and wherein the first plurality of channels is between about 0.5-2% of the total number of channels.

7. The electroplating apparatus of claim 1, wherein the first plurality of channels that are not perpendicular to the plane defined by the plating face of the substrate are located in a peripheral portion of the flow-shaping element and surround the second plurality of channels that are perpendicular to the plane defined by the plating face of the substrate.

8. The electroplating apparatus of claim 1, wherein the channels from the first plurality of channels have larger diameters than the channels from the second plurality of channels.

9. The electroplating apparatus of claim 1, wherein the flow-shaping element is a planar disk.

10. The electroplating apparatus of claim 1, wherein the substrate-facing surface of the flow-shaping element is convex.

11. The apparatus of claim 1, wherein the substrate-facing surface of the flow-shaping element is separated from the plating face of the substrate by a distance of about 10 millimeters or less during electroplating.

12. The apparatus of claim 1, further comprising one or more tubes configured to distribute the electrolyte within the electroplating apparatus, wherein each tube has a plurality of openings in its wall distributed to provide greater flow of electrolyte to a central portion of the plating chamber.

13. The apparatus of claim 1, further comprising one or more tubes configured to distribute the electrolyte within the electroplating apparatus, wherein each tube has a plurality of openings in its wall distributed to provide greater flow of electrolyte to a peripheral portion of the plating chamber.

14. The apparatus of claim 1, further comprising one or more tubes configured to distribute the electrolyte within the electroplating apparatus, wherein each tube has a plurality of openings in its wall distributed to provide uniform flow of electrolyte to the plating chamber.

* * * * *